US012593425B2

(12) United States Patent
Sasaki

(10) Patent No.: US 12,593,425 B2
(45) Date of Patent: Mar. 31, 2026

(54) EXHAUST HEAT DEVICE AND SERVER COOLING SYSTEM

(71) Applicant: SHINWA CONTROLS CO., LTD, Kanagawa-ken (JP)

(72) Inventor: Isamu Sasaki, Kanagawa-ken (JP)

(73) Assignee: SHINWA CONTROLS CO., LTD, Kanagawa-ken (JP)

( * ) Notice: Subject to any disclaimer, the term of this patent is extended or adjusted under 35 U.S.C. 154(b) by 0 days.

(21) Appl. No.: 19/207,092

(22) Filed: May 13, 2025

(65) Prior Publication Data

US 2026/0068103 A1 Mar. 5, 2026

Related U.S. Application Data

(63) Continuation of application No. PCT/JP2024/031112, filed on Aug. 30, 2024.

(51) Int. Cl.
*H05K 7/20* (2006.01)

(52) U.S. Cl.
CPC ............................... *H05K 7/20736* (2013.01)

(58) Field of Classification Search
CPC .................................................. H05K 7/20736
See application file for complete search history.

(56) References Cited

U.S. PATENT DOCUMENTS 6,819,563 B1* 11/2004 Chu .................... H05K 7/20736
165/104.33
2002/0014324 A1 2/2002 DiPaolo 2007/0274043 A1* 11/2007 Shabany ............ H05K 7/20781
361/696
2009/0268404 A1 10/2009 Chu et al.
2012/0138285 A1* 6/2012 Tsubaki ............. H05K 7/20781
165/104.14
2017/0198973 A1 7/2017 Bugler

FOREIGN PATENT DOCUMENTS

| CN | 111928678 A | 11/2020 |
| JP | 3871012 B2 * | 1/2007 |
| JP | 2009-068736 A | 4/2009 |
| JP | 2015-535070 A | 12/2015 |
| JP | 2017-033427 A | 2/2017 |
| JP | 2017-138060 A | 8/2017 |
| JP | 2021-530046 A | 11/2021 |
| JP | 2021-196130 A | 12/2021 |
| JP | 2024-039232 A | 3/2024 |
| TW | 202228498 A | 7/2022 |

* cited by examiner

*Primary Examiner* — Jianying C Atkisson
*Assistant Examiner* — Khaled Ahmed Ali Al Samiri
(74) *Attorney, Agent, or Firm* — Studebaker Brackett PLLC

(57) ABSTRACT

In a server cooling system S according to this embodiment, an exhaust heat device 1 includes: an air-cooled heat exchanger 30 that includes a heat exchange core 30C having a first surface 30A and a second surface 30B; and a plurality of blowers 20 that causes air as a gas to flow such that the air passes from the first surface 30A to the second surface 30B by rotation of impellers. The heat exchange core 30 includes a plurality of tubes 313 and 323 through which a heating medium that exchanges heat with the air flows. Each of the tubes 313 and 323 extends in a meandering pattern from a side of the second surface 30B to a side of the first surface 30A, the heating medium flowing from the side of the second surface 30B to the side of the first surface 30A in each of the tubes 313 and 323.

4 Claims, 16 Drawing Sheets

313a, 313          313a, 313          313a, 313

313a, 313          313a, 313          313a, 313

313a, 313          313a, 313          313a, 313

313a, 313          313a, 313          313a, 313

| | Air flow side settings | | | Heating medium side settings | | | Performance | |
|---|---|---|---|---|---|---|---|---|
| | Blower flow rate (m³/min) | Air inlet temperature (°C) | Air outlet temperature (°C) | Pressure loss (Pa) | Heating medium flow rate (L/min) | Heating medium inlet temperature (°C) | Heating medium outlet temperature (°C) | Cooling capacity (kW) | C O P |
| Setting example | 360 | 35 | 57 | 250 | 76 | 70 | 40 | 150 | 15 ≦ |

FIG.10

EXHAUST HEAT DEVICE AND SERVER COOLING SYSTEM

CROSS-REFERENCE TO RELATED APPLICATION

This application is based upon and claims the benefit of priority from International Patent Application No. PCT/JP2024/031112, filed Aug. 30, 2024, the entire contents of which are incorporated herein by reference.

TECHNICAL FIELD

An embodiment of the present invention relates to an exhaust heat device and a server cooling system.

BACKGROUND ART

Recently, there has been a rapid increase in demand for cloud services, generative AI, and the like, and the construction of new data centers is expanding rapidly in response to this.

Data centers are equipped with various devices such as servers. The servers installed in the recent data centers include many computing devices such as CPUs and GPUS. Then, such computing devices perform arithmetic processing with a much greater load than before.

The power consumption of the computing device increases in proportion to the load of arithmetic processing of the computing device. For this reason, the power consumption of devices such as servers in recent data centers is extremely high.

Further, the heat generation and the temperature of the computing device increase in proportion to the processing load and power consumption of the computing device. The operating temperature (operating guaranteed temperature) of the computing device is generally set at a relatively high level, but excessive temperature increases in the computing device can cause an operational malfunction of the computing device. For this reason, it is necessary to properly cool the devices such as servers in data centers.

Cooling of devices such as servers has been carried out conventionally (e.g., JP2017-33427A). However, in recent data centers, the amount of heat generated by devices such as servers has become significantly greater than before, and it is necessary to cool the devices with a cooling capacity that is significantly greater than before.

DISCLOSURE OF INVENTION

As described above, the computing device in devices such as servers installed in recent data centers performs arithmetic processing with a much greater load than before. For this reason, the power consumption of devices such as servers has increased significantly. Further, the amount of heat generated by the computing device tends to be significantly higher than before. For this reason, in recent data centers, the increase in power consumption for computing and the increase in power consumption for cooling have become issues.

The coefficient of performance (COP) is an indicator used to evaluate the efficiency of cooling in relation to power consumption. The COP is determined by the cooling capacity/power consumption, and a higher COP means higher cooling efficiency. In previous data centers, the power consumption for computing and cooling was not excessive, and thus, it cannot be necessarily said that cooling facilities were constructed with a focus on the COP. However, it is desired to improve the COP as much as possible in the cooling of future data centers.

Further, when constructing cooling facilities for recent or future data centers where large amounts of heat are expected to be generated, it is not possible to achieve effective cooling without fully considering the introduction cost, characteristics of the inside of the data center, and the like to a greater extent than before.

In detail, in previous data centers, although the devices could be sufficiently cooled using only a generally low-output air-cooled exhaust heat device, the heat that can be generated in, for example, the device in recent data centers cannot be sufficiently dissipated using such an existing exhaust heat device and desired cooling cannot be sufficiently achieved. In such a situation, it is conceivable that, for example, the device can be efficiently cooled by installing a cooling tower in the data center like in a semiconductor production plant. However, the installation of a cooling tower can be over-specified for cooling in the data center, and thus, the introduction cost can be an issue. Further, when considering the operation of the cooling tower, it cannot be necessarily said that it is efficient in terms of power consumption.

Meanwhile, in the case where an air-cooled exhaust heat device is used as before, a large cooling capacity can be secured by driving a blower at a large air volume. However, in this case, the COP can increase. Further, dust becomes airborne, which can lead to undesirable conditions for the preservation of the device. Furthermore, noise can also be a problem. Further, when the air volume is increased, the pressure loss will also increase and the cooling performance reach saturation in some cases.

Further, the user of a cooling tower or a blower with a large air volume can lead to the enlargement of the exhaust heat device or the entire facility including the exhaust heat device. Although relatively large spaces for installing devices are generally provided in data centers, the number of servers that can be installed can be increased if the space occupied by cooling facilities such as exhaust heat devices can be reduced. Therefore, it is naturally desired to perform cooling efficiently while reducing the space occupied by cooling facilities.

As described above, for example, there are various issues to consider when it comes to cooling in future data centers, and the establishment of effective cooling methods is still in the trial and error stage.

In particular, the present inventors estimate that a large number of server racks with specifications that produce approximately 150 kW of heat generation per unit will be introduced in future data centers. Specifically, for example, if a server rack with such specifications can be cooled extremely efficiently in a manner that is suitable for the data center, it will make a significant contribution to solving the problem of power consumption assumed in future data centers.

The present disclosure has been conceived from the above background and aims to provide an exhaust heat device and a server cooling system that suitably realize efficient cooling while reducing the introduction cost and the space occupied by devices.

An embodiment of the present invention relates to the following aspects.

3

<1>

An exhaust heat device, including:

an air-cooled heat exchanger that includes a heat exchange core having a first surface and a second surface opposite to the first surface; and a plurality of blowers that causes (or a plurality of blowers configured to cause) a gas to flow such that the gas passes from the first surface to the second surface by rotation of impellers, the heat exchange core including a plurality of tubes through which a heating medium that intends to exchange heat with the gas flows, each of the plurality of tubes extending in a meandering pattern from a side of the second surface to a side of the first surface, the heating medium flowing from the side of the second surface to the side of the first surface in each of the plurality of tubes.

<2>

The exhaust heat device according to <1>, in which the heat exchanger includes an inflow portion that receives the heating medium from outside and causes the heating medium to flow into the tubes, and the tubes branch off in parallel from the inflow portion.

<3>

The exhaust heat device according to <1> or <2>, in which each of the tubes forms a meandering shape by alternately and sequentially connecting a main flow path element extending linearly and a U-shaped return flow path element, the plurality of blowers is arranged such that an extension of a rotation axis of each of the impellers is orthogonal to the second surface, and the adjacent main flow path elements connected by the return flow path element do not overlap at least in part when viewed in a direction from the first surface to the second surface.

<4>

The exhaust heat device according to any one of <1> to <3>, in which the heat exchanger includes a plurality of plate fins that extends parallel to a direction from the first surface to the second surface and is arranged in a direction orthogonal to the direction from the first surface to the second surface, and each of the tubes extends in a meandering pattern from the side of the second surface to the side of the first surface while penetrating the plurality of plate fins and comes into contact with the plate fins.

<5>

The exhaust heat device according to <1>, in which the plurality of blowers are arranged in a plurality of rows and a plurality of columns.

<6>

The exhaust heat device according to any one of <1> to <5>, in which an area of each of the first surface and the second surface of the heat exchange core is set to 1.5 m² or more and 1.7 m² or less, a flow rate of the gas caused to flow by the plurality of blowers is set to 345 m³/min or more and 375 m³/min or less, a heating medium is selected and a flow rate of the heating medium is set such that a value (C·L) obtained by multiplying a specific heat C (KJ/kg·K) of the heating medium at 20° C. to 40° C. and a flow rate L (L/min) of the heating medium is 250 or more and 320 or less, and a cooling capacity of 140 kW or more and 160 kw or less is output.

<7>

The exhaust heat device according to <6>, in which a heating medium cooling efficiency (LPM/kW) determined by dividing the flow rate (L/min: LPM) of the heating medium by the cooling capacity is 1.4 or more.

<8>

The exhaust heat device according to <6> or <7>, in which a cooling capacity of 140 kw or more and 160 kw or less with a COP of 15 or more is output.

<9>

The exhaust heat device according to any one of <1> to <8>, in which the heat exchanger includes a plurality of plate fins that extends parallel to a direction from the first surface to the second surface and is arranged in a direction orthogonal to the direction from the first surface to the second surface, each of the tubes extends in a meandering pattern from the side of the second surface to the side of the first surface while penetrating the plurality of plate fins and comes into contact with the plate fins, and a total area of heat exchange surfaces of the plurality of plate fins and heat exchange surfaces of the tubes is 600 m² or more.

<10>

The exhaust heat device according to <2>, in which the heat exchange core includes a first heat exchange core and a second heat exchange core, the first heat exchange core and the second heat exchange core being arranged so as to be adjacent to each other, the heat exchanger includes, as the inflow portion, an inflow portion that is connected to the tube of the first heat exchange core and an inflow portion that is connected to the tube of the second heat exchange core, which are separated from each other, the inflow portion that is connected to the tube of the first heat exchange core and the inflow portion that is connected to the tube of the second heat exchange core extend in a direction in which the first heat exchange core and the second heat exchange core are adjacent to each other, and the inflow portion that is connected to the tube of the first heat exchange core and the inflow portion that is connected to the tube of the second heat exchange core are arranged such that they are shifted in a direction from the first surface to the second surface and an end portion on the second heat exchange core side of the inflow portion that is connected to the tube of the first heat exchange core overlaps with an end portion on the first heat exchange core side of the inflow portion that is connected to the tube of the second heat exchange core when viewed in the direction from the first surface to the second surface.

<11>

The exhaust heat device according to <10>, in which an inlet of the heating medium in the inflow portion that is connected to the tube of the first heat exchange core and an inlet of the heating medium in the inflow portion that is connected to the tube of the second heat exchange core open in the direction from the first surface to the second surface or a direction opposed thereto.

<12>

The exhaust heat device according to any one of <1> to <11>, in which the exhaust heat device includes two heat exchanger, the two heat exchangers are arranged so as to form a V-shape, and some of the plurality of blowers are arranged so as to be adjacent to one of the two heat exchangers such that an extension of a rotation axis of each impeller intersects with the second surface of the one heat exchanger, and the others of the plurality of blowers are arranged so as to be adjacent to the other of the two heat exchangers such that an extension of a rotation axis of each impeller intersects with the second surface of the other heat exchanger.

<13>

The exhaust heat device according to <12>, in which settings of a flow rate of the gas caused to flow by the plurality of blowers or settings of a rotation speed of the plurality of blowers differ depending on a distance between each blower and the heat exchanger adjacent to the blower.

<14>

A server cooling system, including:

the exhaust heat device according to any one of <1> to <13>; and a server rack to which the heating medium is supplied from the exhaust heat device, the server rack including a cooling flow path that receives the heating medium, which has exchanged heat with the gas, and causes it to flow, and returning the heating medium flowing out from the cooling flow path to the exhaust heat device.

According to an embodiment of the present invention, it is possible to suitably realize efficient cooling while reducing the introduction cost and the space occupied by devices.

BRIEF DESCRIPTION OF DRAWINGS

FIG. 10 is a diagram showing a table that describes an example of the specifications of the Server cooling system shown in FIG. 1.

MODE(S) FOR CARRYING OUT THE INVENTION

An embodiment will be described below.

<Configuration of Server Cooling System>

Figure 1:
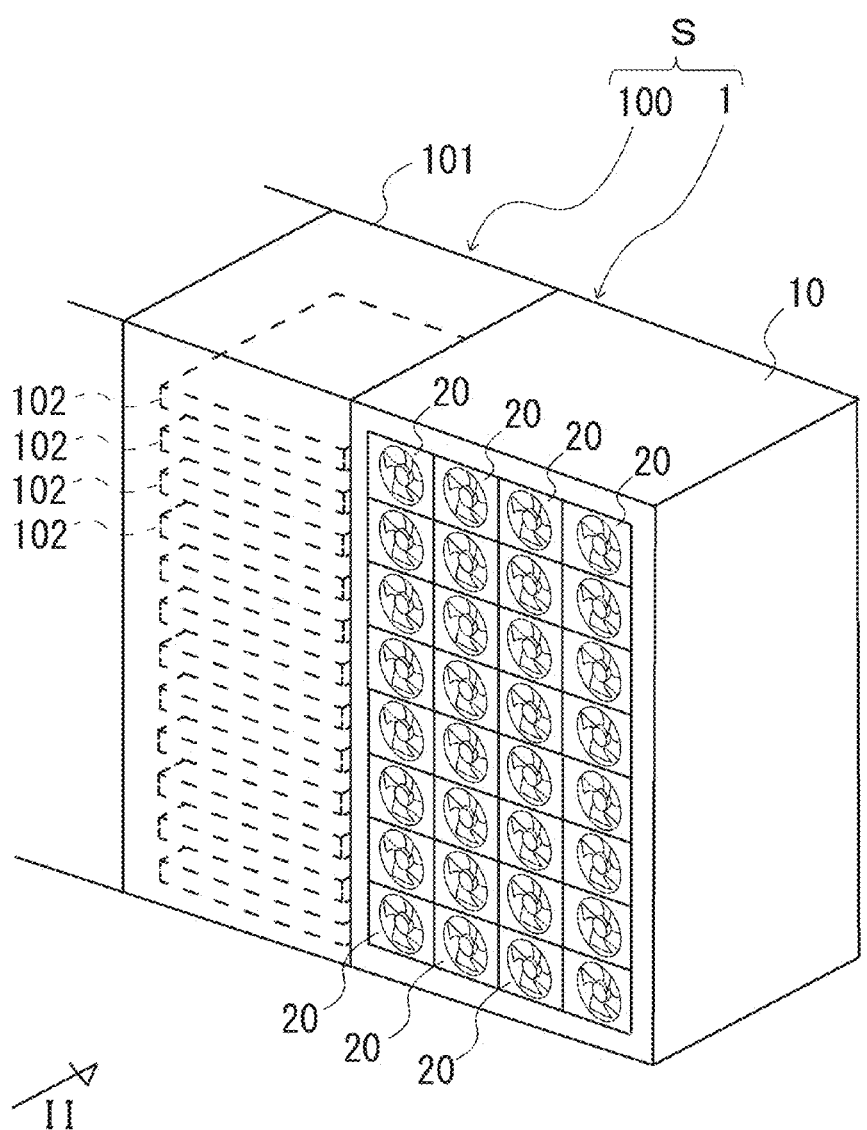
FIG. 1 is a perspective view of a Server cooling system according to an embodiment.

FIG. 1 is a perspective view of a server cooling system S according to an embodiment. The server cooling system S includes an exhaust heat device 1 and a server rack 100.

The exhaust heat device 1 and the server rack 100 are installed adjacent to each other in a horizontal direction. FIG. 1 shows an example in which the server cooling system S is installed in a data center. However, the place where the server cooling system S is used is not limited to the data center.

The server rack 100 accommodates servers 102 as a plurality of electronic apparatuses inside a rack body 101. The rack body 101 includes shelf portions (not shown) arranged in the up-and-down direction. In the illustrated example, the servers 102 are installed on the plurality of shelf portions in the rack body 101. As a result, the plurality of servers 102 is accommodated in the rack body 101 such that they overlap in the up-and-down direction.' The server 102 may include a computing device such as a CPU and a GPU, a memory, and the like.

<Exhaust Heat Device>

The exhaust heat device 1 is a device that removes the heat generated by the server 102 inside the rack body 101 and thereby cools the server 102. The exhaust heat device 1 includes an enclosure 10 with rectangular parallelepiped shape, an air-cooled heat exchanger 30 (see FIG. 3, FIG. 4, etc.), and blowers 20.

The enclosure 10 is open on both sides in a direction orthogonal to the horizontal plane of the direction in which the exhaust heat device 1 and the Server rack 100 are adjacent to each other. The enclosure 10 accommodates the heat exchanger 30 thereinside. Then, the blowers 20 are held in the enclosure 10 so as to fill the open part on one side of the enclosure 10.

The heat exchanger 30 is of an air-cooled type that cools a heating medium that is a liquid caused to flow thereinside by causing the heating medium to exchange heat with the air as a gas. The blowers 20 cause the air to flow through heat exchanger 30, thereby promoting heat exchange between the heating medium and the air.

In the exhaust heat device 1, the heating medium cooled by the heat exchanger 30 is supplied to the server rack 100, and at this time, the heating medium absorbs heat from the server 102 to cool the server 102. After cooling the server 102, the heating medium returns to the heat exchanger 30. The heating medium returned to the heat exchanger 30 is cooled again by the air, and is then supplied to the server rack 100 again. The blower 20 and the heat exchanger 30 constituting the exhaust heat device 1 will be described below in detail.

(Blower)

Figure 2:
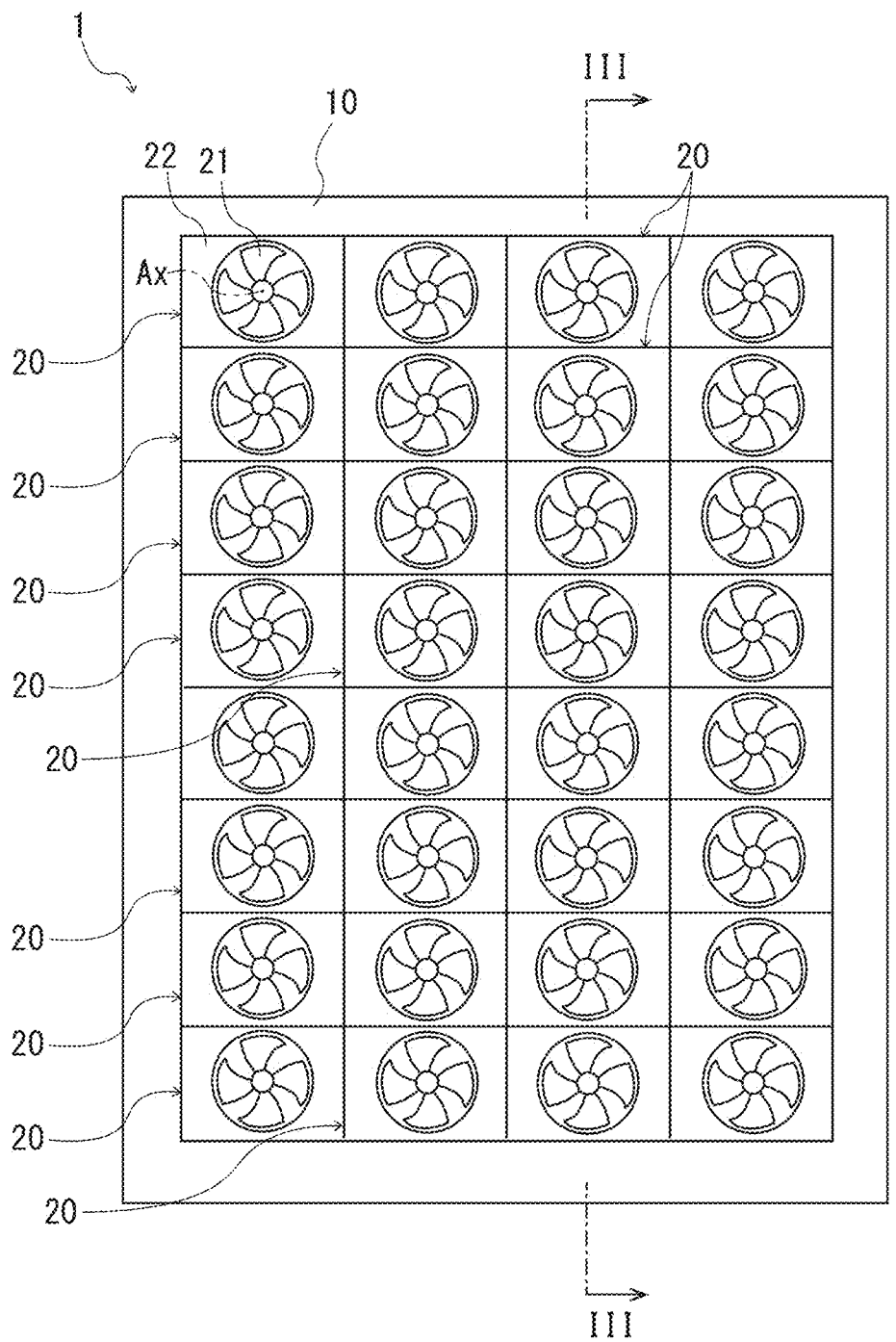
FIG. 2 is a diagram of an exhaust heat device constituting the server cooling system shown in FIG. 1 as viewed in the direction of an arrow II in FIG. 1.
Figure 3:
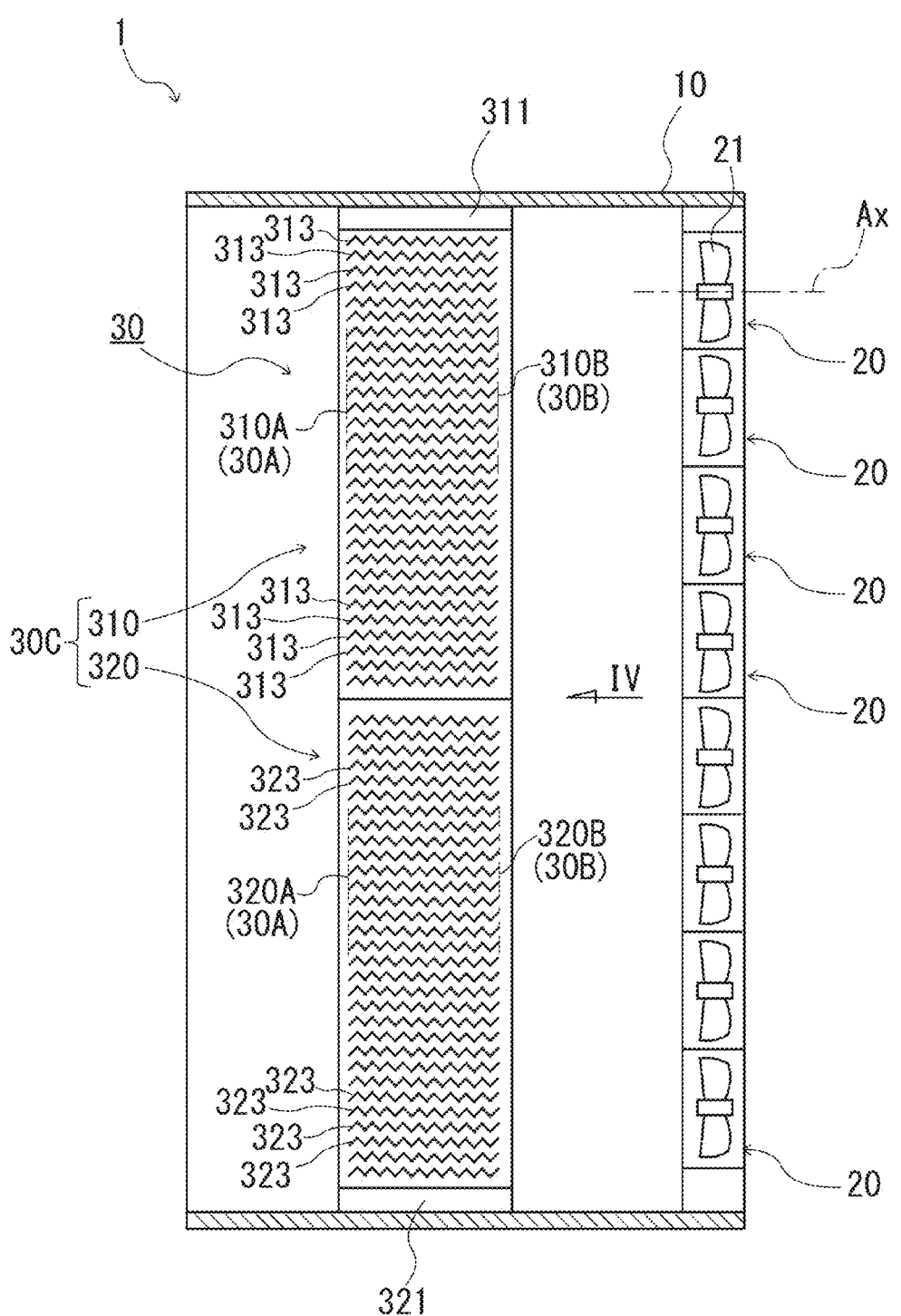
FIG. 3 is a cross-sectional view of the exhaust heat device taken along the line III-III in FIG. 2.

FIG. 2 is a diagram of the exhaust heat device 1 as viewed in the direction of an arrow II in FIG. 1. FIG. 3 is a cross-sectional view of the exhaust heat device 1 taken along the line III-III in FIG. 2.

As shown in FIG. 2, the exhaust heat device 1 includes a plurality of blowers 20. In this embodiment, the plurality of blowers 20 is arranged in a plurality of rows and a plurality of columns, and the blowers 20 are adjacent to the heat exchanger 30. In detail, the blowers 20 are adjacent to the heat exchanger 30 in the horizontal direction. The state in which the blowers 20 are adjacent to the heat exchanger 30 in the horizontal direction means the positional relationship between the blower 20 and the heat exchanger 30 where a line extending in the horizontal direction from any portion of the blower 20 passes through any portion of the heat exchanger 30.

In FIG. 3, a reference symbol 30C indicates a heat exchange core 30C in the heat exchanger 30 that causes the heating medium and the air to exchange heat with each other. The heat exchange core 30C has a first surface 30A and a second surface 30B opposite to the first surface 30A. In detail, the plurality of blowers 20 is arranged so as to be adjacent to the second surface 30B of the heat exchange core 30C. In particular, the blowers 20 are favorably arranged so as to be adjacent to the second surface 30B such that the extension of a rotation axis Ax of an impeller 21 thereof described below intersects with the second surface 30B of the heat exchange core 30C. In this embodiment, the blowers 20 are arranged in such a way. The first surface 30A of the heat exchange core 30C faces one side of the direction in which the enclosure 10 opens, and the second surface 30B of the heat exchange core 30C faces the other side in the direction in which the enclosure 10 opens.

The blower 20 includes the impeller 21 and a casing 22 that supports the impeller 21 such that it is rotatable around the rotation axis Ax. The blower 20 is of an axial flow type. The blower 20 causes the air to flow such that the air passes from the first surface 30A of the heat exchange core 30C to the second surface 30B by rotation of the impeller 21. Each of the plurality of blowers 20 is arranged so as to be adjacent to the second surface 30B such that, in detail, the extension of the rotation axis Ax of the impeller 21 thereof intersects with, specifically, is orthogonal to, the second surface 30B of the heat exchange core 30C. In this embodiment, the rotation axis Ax of the impeller 21 of each blower 20 is along (parallel to) the horizontal direction, but the blowers 20 may be arranged such that the rotation axis Ax of the impeller 21 is inclined with respect to the horizontal direction.

In this embodiment, the plurality of blowers 20 is arranged in specifically eight rows and four columns. That is, the heat exchanger 30 includes 32 blowers 20. The number and arrangement of the blowers 20 are not limited, and the number of blowers 20 may be one. However, in the case where a plurality of blowers 20 is used, when some of the blowers 20 are damaged, the remaining blowers 20 can be used to cause the air to flow, and thus, the function of the exhaust heat device 1 is prevented from decreasing. Further, as compared with the case where one large-scale blower is used, the power of the blower for obtaining a desired cooling capacity can be reduced.

In particular, in the case where the blowers 20 are arranged in four or more rows and four or more columns, by distributing two or more blowers 20 above and below or right and left with reference to the center of the heat exchange core 30C or the vicinity thereof, it is possible to effectively suppress the decrease in the function of the exhaust heat device 1 when some of the blowers 20 are damaged. In this embodiment, 16 blowers 20 are distributed above and below and right and left with reference to the center of the heat exchange core 30C. In the case where a plurality of blowers 20 is used, each blower 20 may have the same structure and the same size or a different structure and/or size. In this embodiment, each blower 20 has the same structure and the same size, and is basically driven at the same rotation speed to output the same amount of air when given the same amount of electric power. Although all of the plurality of blowers 20 are driven to output the same amount of air in this embodiment, the amount of air or the rotation speed of some of the blowers 20 may be different from that of the others. For example, in the enclosure 10 or the array of the blowers 20, the frictional resistance to the flow of air can be greater on the outer periphery side than on the center side. Considering this, the amount of air or the rotation speed of the blowers 20 located on the outer periphery side (the enclosure 10 side), of the plurality of blowers 20, may be greater than that of the blowers 20 located on the center side than the blowers on the outer periphery side.

Further, in the case where the blowers 20 are arranged in four or more rows and four or more columns, it is possible to increase the amount of air passing linearly from the first surface 30A to the second surface 30B. In this case, it can be advantageous in terms of suppressing the pressure loss and improving the heat exchange efficiency. Further, although the blowers 20 are arranged so as to be adjacent to the second surface 30B in this embodiment, the blowers 20 may be adjacent to the first surface 30A and cause a gas to flow such that the gas passes from the first surface 30A to the second surface 30B. However, when the gas passes through the blowers 20, the temperature of the gas rises, and thus, it is favorable that the blowers 20 are arranged on the downstream side of the heat exchange core 30C, i.e., so as to be adjacent to the second surface 30B, from the viewpoint of cooling efficiency.

(Heat Exchanger)

The heat exchanger 30 includes the heat exchange core 30C having the above-mentioned first surface 30A and second surface 30B. As shown in FIG. 3, the heat exchange core 30C includes a plurality of tubes 313 and 323 through which the heating medium flows. The heat exchange core 30C causes the heating medium flowing through the tubes 313 and 323 to exchange heat with the air passing through the heat exchange core 30C to cool the heating medium. The first surface 30A and the second surface 30B are parallel to each other but may be non-parallel.

Figure 4:
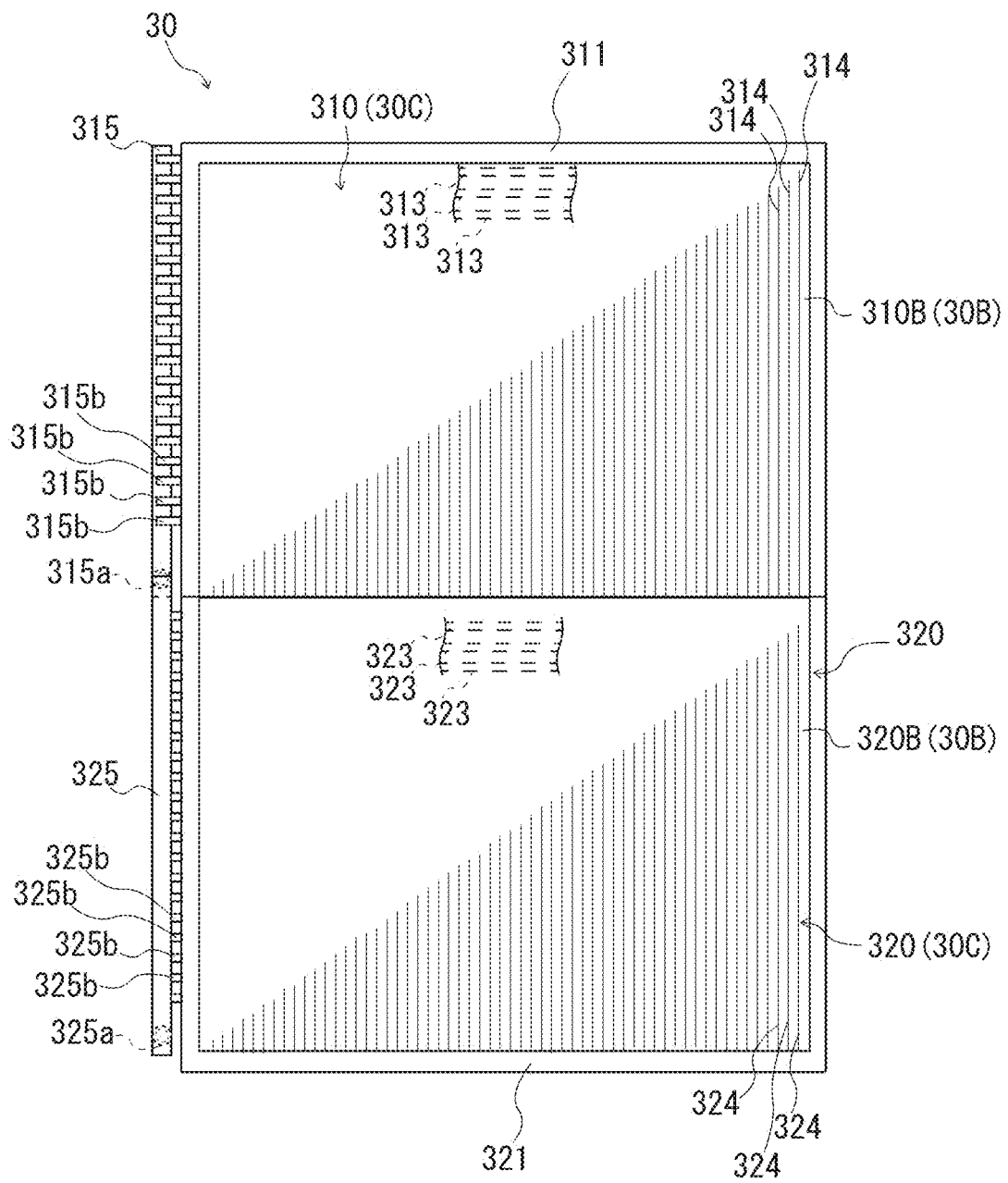
FIG. 4 is a diagram of a heat exchanger constituting the exhaust heat device as viewed from the direction of an arrow IV in FIG. 3.
Figure 5:
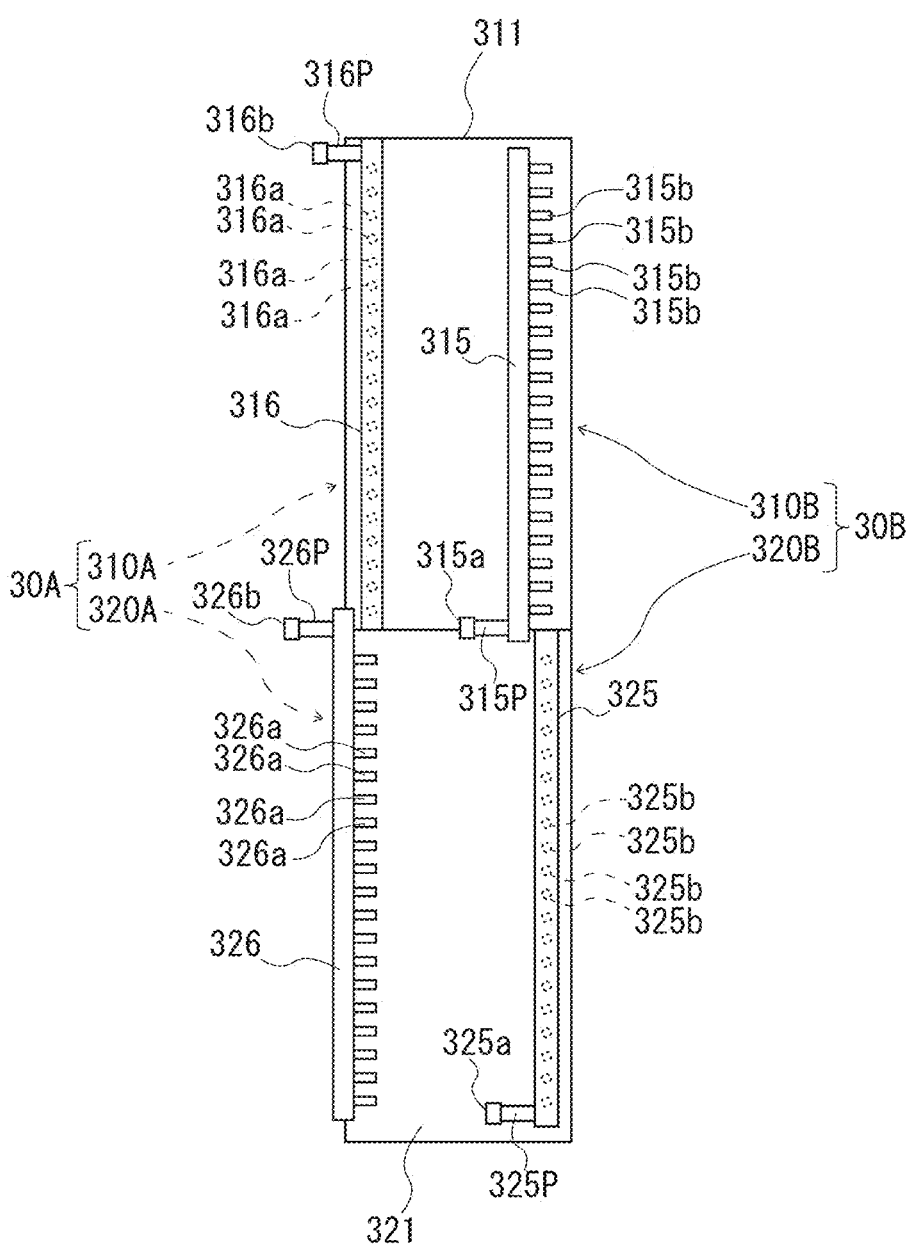
FIG. 5 is a side view of the heat exchanger shown in FIG. 4.

FIG. 4 is a diagram of the heat exchanger 30 as viewed in the direction of an arrow IV in FIG. 3. FIG. 5 is a side view of the heat exchanger 30 shown in FIG. 4. As shown in FIG. 3 to FIG. 5, the heat exchange core 30C in this embodiment includes an upper heat exchange core 310 and a lower heat exchange core 320. The upper heat exchange core 310 is stacked on the lower heat exchange core 320. The upper heat exchange core 310 corresponds to a first heat exchange core, the lower heat exchange core 320 corresponds to a second heat exchange core, and they are arranged so as to be adjacent to each other.

The upper heat exchange core 310 has an upper first surface 310A and an upper second surface 310B opposite to the upper first surface 310A. The lower heat exchange core 320 has a lower first surface 320A and a lower second surface 320B opposite to the lower first surface 320A. The upper first surface 310A and the lower first surface 320A are arranged vertically to form the first surface 30A of the heat exchange core 30C. The upper second surface 310B and the lower second surface 320B are arranged vertically to form the second surface 30B of the heat exchange core 30C.

The upper heat exchange core 310 and the lower heat exchange core 320 are both substantially rectangular parallelepiped. The upper part and both side portions of the upper heat exchange core 310 are covered with and joined to an upper frame 311. The lower part and both side portions of the lower heat exchange core 320 are covered with and joined to a lower frame 321. The upper heat exchange core 310 and the lower heat exchange core 320 are integrated by the upper frame 311 and the lower frame 321 being vertically connected, thereby constituting the heat exchange core 30C.

The heat exchanger 30 includes inflow portions 315 and 325 that receive a heating medium from the outside (the server rack 100 side) and cause it to flow into the tubes 313 and 323, and outflow portions 316 and 326 that receive a heating medium flowing out from the tubes 313 and 323 and cause it to flow out to the outside (the server rack 100 side).

In this embodiment, the upper heat exchange core 310 includes the tube 313, and the lower heat exchange core 320 includes the tube 323. Then, as shown in FIG. 4 and FIG. 5, the heat exchanger 30 includes, as the inflow portions 315 and 325, the upper inflow portion 315 that is connected to the tube 313 of the upper heat exchange core 310 and the lower inflow portion 325 that is connected to the tube 323 of the lower heat exchange core 320, which are separated from each other. The heat exchanger 30 includes, as the outflow portions 316 and 326, the upper outflow portion 316 that is connected to the tube 313 of the upper heat exchange core 310 and the lower outflow portion 326 that is connected to the tube 323 of the lower heat exchange core 320, which are separated from each other.

Each of the tubes 313 in the upper heat exchange core 310 connects the upstream end to the upper inflow portion 315 such that they branch off in parallel from the upper inflow portion 315. Then, each of the tubes 313 in the upper heat exchange core 310 connects the downstream end to the upper outflow portion 316. Similarly, each of the tubes 323 in the lower heat exchange core 320 connects the upstream end to the lower inflow portion 325 such that they branch off from the lower inflow portion 325. Then, each of the tubes 323 in the lower heat exchange core 320 connects the downstream end to the lower outflow portion 326.

In detail, an upper inlet pipe 315P including an inlet 315a of a heating medium and a plurality of upper first relay pipes 315b are connected to the upper inflow portion 315. A plurality of upper second relay pipes 316a and an upper outlet pipe 316P including an outlet 316b of a heating medium are connected to the upper outflow portion 316. The plurality of upper first relay pipes 315b is connected to the upstream end of the corresponding tube 313. The plurality of upper second relay pipes 316a is connected to the downstream end of the corresponding tube 313. The plurality of upper first relay pipes 315b and the plurality of upper second relay pipes 316a are arranged in the up-and-down direction, and the plurality of tubes 313 connected by them are also arranged in the up-and-down direction.

With the above connection mode, in the upper heat exchange core 310, the heating medium flowing into the upper inflow portion 315 from the inlet 315a flows into each tube 313 via each upper first relay pipe 315b from the upper inflow portion 315. Then, the heating medium flowing out from the downstream end of each tube 313 flows into the upper outflow portion 316 via each upper second relay pipe 316a, and can flow out from the outlet 316b of the upper outflow portion 316.

Similarly, a lower inlet pipe 325P including an inlet 325a of a heating medium and a plurality of lower first relay pipes 325b are connected to the lower inflow portion 325. A plurality of lower second relay pipes 326a and a lower outlet pipe 326P including an outlet 326b of a heating medium are connected to the lower outflow portion 326. The plurality of lower first relay pipes 325b is connected to the upstream end of the corresponding tube 323. The plurality of lower second relay pipes 326a is connected to the downstream end of the corresponding tube 323. The flow of the heating medium on the lower side is similar to the flow of the heating medium on the above-mentioned upper side.

In this embodiment, the inlets 315a and 325a of the heating medium in the upper inflow portion 315 and the lower inflow portion 325 and the outlets 316b and 326b of the heating medium in the upper outflow portion 316 and the lower outflow portion 326 open in the direction from the second surface 30B to the first surface 30A. The upper inlet pipe 315P, the upper outlet pipe 316P, the lower inlet pipe 325P, and the lower outlet pipe 326P extend in the direction from the second surface 30B to the first surface 30A. In this case, the lateral protrusion of the inlet portion and outlet portion of the heating medium is suppressed, which is advantageous in terms of reducing the size of the entire heat exchanger 30 and providing the area of the heat exchange core 30C. Note that the inlets 315a and 325a and the outlets 316b and 326b may open in the direction from the first surface 30A to the second surface 30B. Further, the inlets 315a and 325a of the heating medium in the upper inflow portion 315 and the lower inflow portion 325 are formed on the lower side of the corresponding heat exchange core. The outlets 316b and 326b of the heating medium in the upper outflow portion 316 and the lower outflow portion 326 are formed on the upper side of the corresponding heat exchange core. In this case, the lengths of the flow paths of the heating medium, which branch off in parallel, are generally uniform, and uniformly cooling is possible in the entire heat exchange core.

As shown in FIG. 5, the upper inflow portion 315 and the lower inflow portion 325 have each a pipe body. Then, the upper inflow portion 315 and the lower inflow portion 325 are arranged at positions closer to the second surface 30B on the side of one side portion of the heat exchange core 30C. Then, the upper inflow portion 315 and the lower inflow portion 325 extend in the up-and-down direction, in other words, in the direction in which the upper heat exchange core 310 and the lower heat exchange core 320 are adjacent to each other. Here, the upper inflow portion 315 and the lower inflow portion 325 are arranged so as to be shifted in the direction from the first surface 30A to the second surface 30B each other. Further, the upper inflow portion 315 and the lower inflow portion 325 are arranged such that the lower part of the upper inflow portion 315 overlaps with the upper part of the lower inflow portion 325 when viewed in the direction from the first surface 30A to the second surface 30B (see also FIG. 4). In other words, the upper end of the lower inflow portion 325 is located above the lower end of the upper inflow portion 315 and the upper part of the lower inflow portion 325 including the upper end of the lower inflow portion 325 overlaps with the upper inflow portion 315.

Similarly, the upper outflow portion 316 and the lower outflow portion 326 have each a pipe body. Then, the upper outflow portion 316 and the lower outflow portion 326 are arranged at positions closer to the first surface 30A on the side of one side portion of the heat exchange core 30C. Then, the upper outflow portion 316 and the lower outflow portion 326 extend in the up-and-down direction. Then, the upper outflow portion 316 and the lower outflow portion 326 are also arranged so as to be shifted in the direction from the first surface 30A to the second surface 30B each other. Further, the upper outflow portion 316 and the lower outflow portion 326 are arranged such that the lower part of the upper outflow portion 316 overlaps with the upper part of the lower outflow portion 326 when viewed in the direction from the first surface 30A to the second surface 30B.

In this embodiment, as described above, the upper inflow portion 315 and the lower inflow portion 325 are arranged such that they are shifted in the direction from the first surface 30A to the second surface 30B. Further, the upper outflow portion 316 and the lower outflow portion 326 are arranged such that they are shifted in the direction from the first surface 30A to the second surface 30B. In this case, it is possible to bring the upper heat exchange core 310 and the lower heat exchange core 320 close together in the up-and-down direction while avoiding undesired interference between members, which is advantageous in terms of reducing the entire size and providing the area of the heat exchange core 30C.

Further, in this embodiment, as shown in FIG. 5, the position of the upstream end of each tube 313 of the upper heat exchange core 310 and the position of the upstream end of each tube 323 of the lower heat exchange core 320 in the direction from the first surface 30A to the second surface 30B are the same. Meanwhile, as described above, the upper inflow portion 315 and the lower inflow portion 325 are shifted in the direction from the first surface 30A to the second surface 30B.

Here, the upper first relay pipe 315b connected to the upper inflow portion 315 is formed into a circular arc or substantially L-shaped pipe, and the lower first relay pipe 325b is formed into a straight pipe. The upper inflow portion 315 is located closer to the first surface 30A than the lower inflow portion 325, and the upper first relay pipe 315b having a circular arc or substantially L-shape approaches the upstream end of the tube 313 while extending in the direction from the first surface 30A to the second surface 30B so as to connect to the tube 313. The lower inflow portion 325 is located to face the upstream end of each tube 323 of the lower heat exchange core 320, and is connected to the upstream end of each tube 323 by the lower first relay pipe 325b having a straight pipe shape in the shortest distance. This ensures the fluid connection between each tube 313 of the upper heat exchange core 310 and the upper inflow portion 315 and the fluid connection between each tube 323 of the lower heat exchange core 320 and the lower inflow portion 325 without shifting the position of the upstream end of each tube 313 of the upper heat exchange core 310 and the position of the upstream end of each tube 323 of the lower heat exchange core 320.

Meanwhile, the upper second relay pipe 316a connected to the upper outflow portion 316 is formed into a straight pipe, and the lower second relay pipe 326a is formed into a circular arc or substantially L-shaped pipe. This ensures the fluid connection between each tube 313 of the upper heat exchange core 310 and the upper outflow portion 316 and the fluid connection between each tube 323 of the lower heat exchange core 320 and the lower outflow portion 326 without shifting the position of the downstream end of each tube 313 of the upper heat exchange core 310 and the position of the downstream end of each tube 323 of the lower heat exchange core 320. In the above connection configuration, it is possible to share the structure of the upper heat exchange core 310 and the lower heat exchange core 320, which is advantageous in terms of ease of production. Further, the difference in heat exchange performance between the upper and lower sides is suppressed, and it is possible to carry out efficiently heat exchanging.

Figure 6:
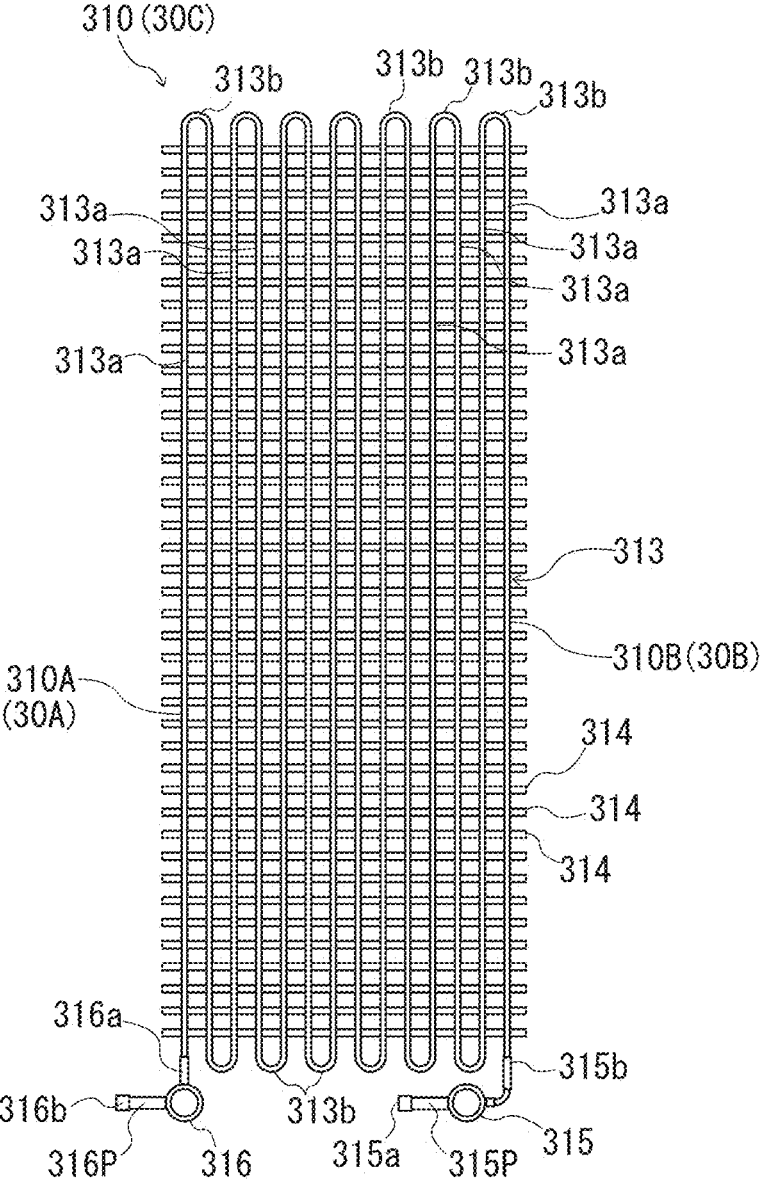
FIG. 6 is a top view of a heat exchange core (upper heat exchange core) in the heat exchanger shown in FIG. 5.

Further, FIG. 6 is a top view of the heat exchange core 30C (upper heat exchange core 310) in the heat exchanger 30 shown in FIG. 5. FIG. 6 shows plate fins 314 provided in the upper heat exchange core 310. The plate fins 314 extend parallel to the direction from the first surface 30A to the second surface 30B and are arranged (lined up) at intervals in the direction orthogonal to this direction. The tube 313 extends in a meandering pattern from the side of the second surface 30B to the side of the first surface 30A while penetrating the plurality of plate fins 314 and comes into contact with the plate fins 314. Specifically, the tube 313 penetrates the plate fin 314 in the direction orthogonal to the plate fin 314. In this embodiment, the plurality of plate fins 314 is provided such that the heat exchange surfaces (two surfaces opposite to each other in the thickness direction) are parallel to the up-and-down direction. Note that as shown in FIG. 4, the lower heat exchange core 320 is provided with plate fins 324 similar to the plate fins 314.

As described above, the upper inflow portion 315 and the lower inflow portion 325 are arranged at positions closer to the second surface 30B. The upper outflow portion 316 and the lower outflow portion 326 are arranged at positions closer to the first surface 30A. Here, each of the tubes 313 and 323 extends from the side of the second surface 30B to the side of the first surface 30A in a meandering pattern in the right and left direction in this example. As a result, in the heat exchanger 30, a heating medium flows the side of the second surface 30B to the side of the first surface 30A in each of the tubes 313 and 323. Meanwhile, the air flows from the side of the first surface 30A to the side of the second surface 30B by the driving of the blowers 20. That is, the heat exchanger 30 is configured as a counterflow heat exchanger that causes the heating medium and the air to flow in opposite directions to each other and exchange heat.

Figure 7:
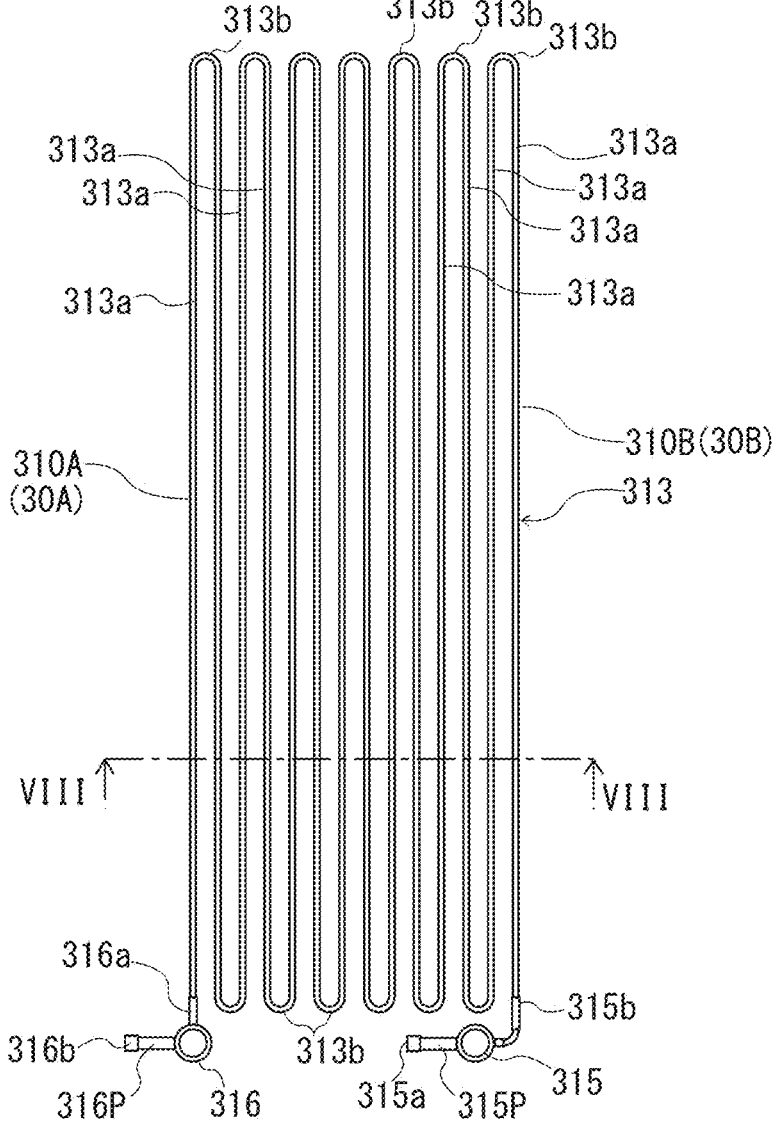
FIG. 7 is a diagram showing the heat exchange core shown in FIG. 6 without the plate fins.
Figure 8:
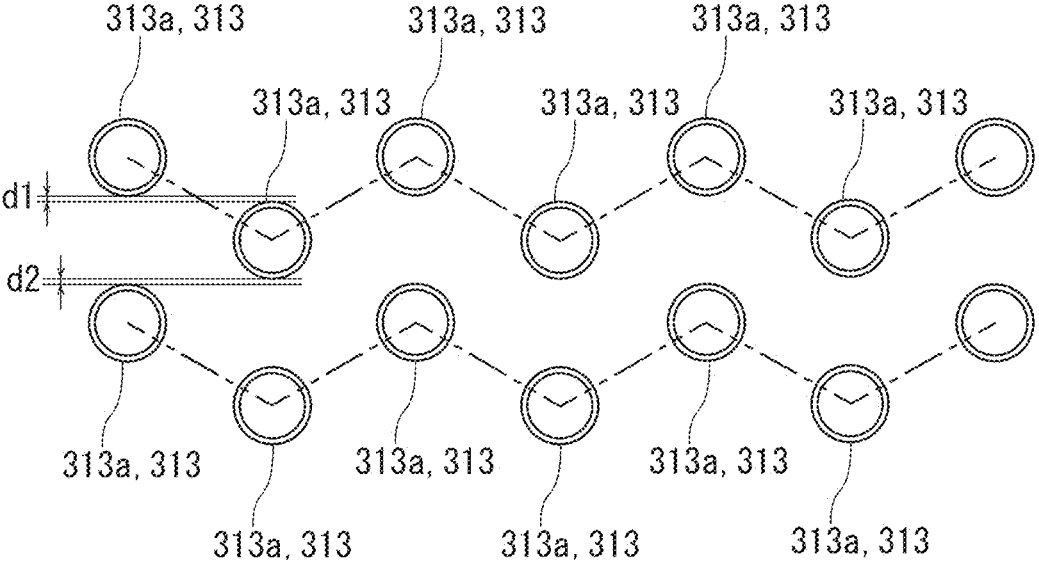
FIG. 8 is a cross-sectional view taken along the line VIII-VIII in FIG. 7.

FIG. 7 is a diagram showing the upper heat exchange core 310 shown in FIG. 6 without the plate fins 314. FIG. 8 is a cross-sectional view taken along the line VIII-VIII in FIG. 7. The shape of the tube 313 will be described below in detail with reference to FIG. 6 to FIG. 8.

As shown in FIG. 6 and FIG. 7, the tube 313 forms a meandering shape by alternately and sequentially connecting a main flow path element 313a extending linearly and a U-shaped return flow path element 313b. The plurality of main flow path elements 313a is arranged parallel to each other such that they are arranged in the direction in which the air flows by the driving of the blowers 20. The main flow path element 313a located at the most upstream in the direction in which the air flows forms the first surface 30A, and the main flow path element 313a located at the most downstream in the direction in which the air flows forms the second surface 30B. The heat exchange core 30C has a substantially rectangular parallelepiped shape, and the first surface 30A and the second surface 30B correspond to the two surfaces opposite to each other in the substantially rectangular parallelepiped shape.

The main flow path element 313a forming the second surface 30B connects the end portion opposite to the end portion connected to the return flow path element 313b to the upper first relay pipe 315b. The main flow path element 313a forming the first surface 30A connects the end portion opposite to the end portion connected to the return flow path element 313*b* to the upper second relay pipe 316*a*.

Further, referring to FIG. 8, the two adjacent main flow path elements 313*a* connected by the return flow path element 313*b* do not overlap at least in part when viewed in the direction from the first surface 30A to the second surface 30B (left to right in FIG. 8). In detail, in this embodiment, the two adjacent main flow path elements 313*a* connected by the return flow path element 313*b* are spaced apart by a distance d1 in the up-and-down direction, and do not overlap entirely when viewed in the direction from the first surface 30A to the second surface 30B. Further, between the two tubes 313 adjacent to each other in the up-and-down direction, the main flow path element 313*a* of one tube 313 and the main flow path element 313*a* of the other tube 313, which are close to each other, are also spaced apart by a distance d2 in the up-and-down direction.

In the case where the arrangement of the main flow path elements 313*a* described above is adopted, the air easily comes into contact with each main flow path element 313*a*, which can be advantageous in terms of improving the heat exchange efficiency and allows the excessive increase in pressure loss to be suppressed. Note that the tube 323 in the lower heat exchange core 320 has a shape similar to that of the tube 313.

Further, although the plate fins 314 and 324 are used as fins in the heat exchanger 30 in this embodiment, corrugated fins or disk-shaped aerofins may be used. However, in this embodiment, plate fins are adopted from the viewpoint of suppressing the excessive increase in pressure loss.
(Connection Configuration Between Exhaust Heat Device and Server Rack)

The connection configuration between the exhaust heat device 1 and the server rack 100 will be described below with reference to FIG. 9. The exhaust heat device 1 includes a first pump 41 and a second pump 42 for causing a heating medium to flow. The first pump 41 and the second pump 42 may each be, for example, a centrifugal pump driven by an electric motor, but the type thereof is not particularly limited.

The first pump 41 is connected to the inlet 315*a* of the upper inflow portion 315 that is connected to the upper heat exchange core 310. The second pump 42 is connected to the inlet 325*a* of the lower inflow portion 325 that is connected to the lower heat exchange core 320. That is, in this embodiment, a heating medium is supplied to the upper heat exchange core 310 and the lower heat exchange core 320 from the separate pumps 41 and 42. This allows the load of each of the pumps 41 and 42 to be reduced. In particular, in this embodiment, since the upper heat exchange core 310 and the lower heat exchange core 320 overlap vertically, which can require a large amount of power to secure the necessary head (lifting height) in the case of using one pump, the energy-saving effect of separating the pumps is significant. However, a heating medium may be supplied to the entire heat exchange core 30C from one pump.

The heating medium flowing into the tube 313 from the upper inflow portion 315 flows in a meandering pattern from the side of the second surface 30B to the side of the first surface 30A and flows out from the outlet 316*b*. The heating medium flowing into the tube 323 from the lower inflow portion 325 flows in a meandering pattern from the side of the second surface 30B to the side of the first surface 30A and flows out from the outlet 326*b*. Then, the heating media flowing out from the outlets 316*b* and 326*b* merges together and then flow into the server rack 100.

The server rack 100 includes a plurality of cooling flow paths 110 that receives the heating medium, which has exchanged heat with the air, and causes it to flow, and returns the heating medium flowing out from the cooling flow path 110 to the exhaust heat device 1. The heating medium flowing through the cooling flow path 110 absorbs heat from the server 102. Then, the heating medium flowing out from the cooling flow path 110 returns to the exhaust heat device 1 by being sucked into the first pump 41 and the second pump 42 and is cooled again.

Figure 9:
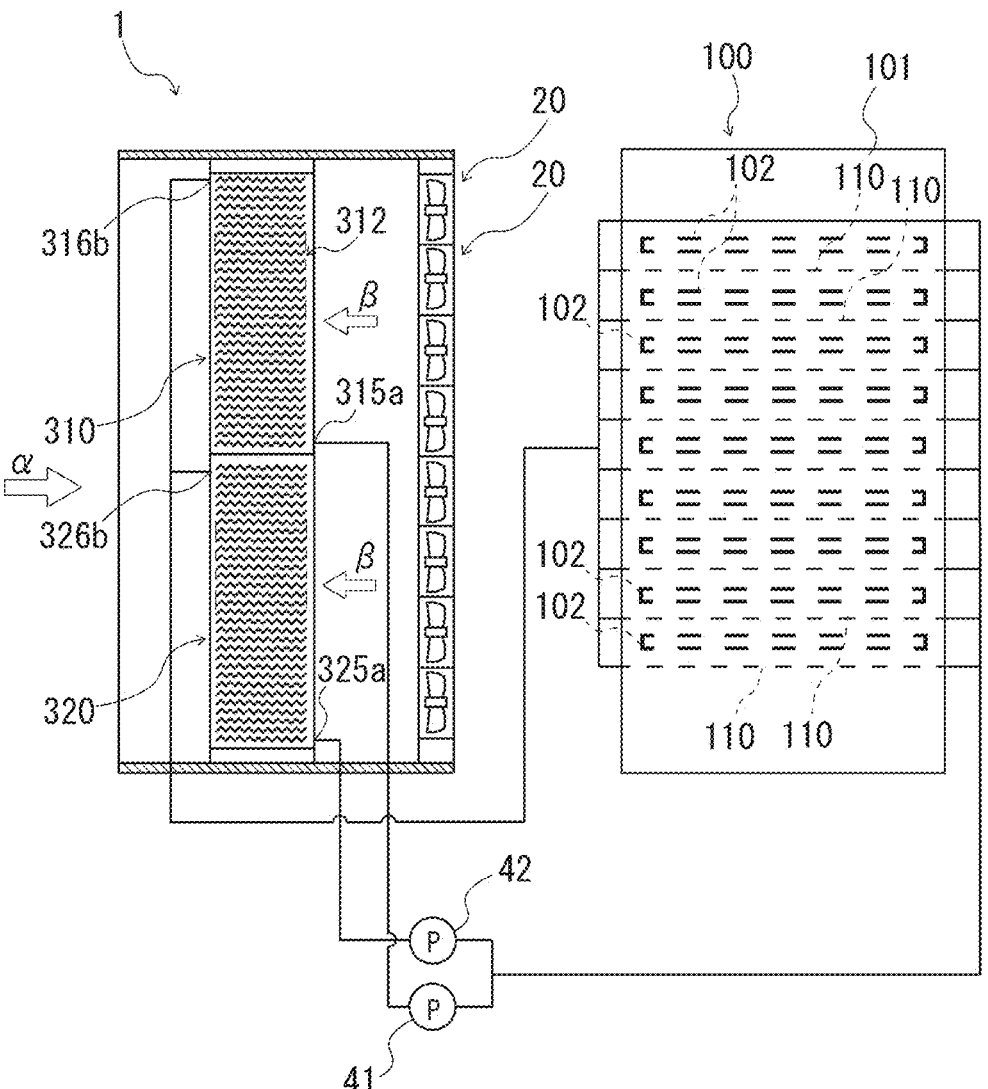
FIG. 9 is a diagram describing a connection configuration between the exhaust heat device and the server rack constituting the server cooling system shown in FIG. 1.

In FIG. 9, an arrow α indicates the orientation of the air flowing by the driving of the blowers 20. An arrow β indicates the orientation of the heating medium flowing from the side of the second surface 30B to the side of the first surface 30A in the upper heat exchange core 310 and the lower heat exchange core 320. The air and the heating medium exchange heat in a counterflow manner.

In the server cooling system S according to this embodiment described above, the exhaust heat device 1 includes the air-cooled heat exchanger 30 that includes the heat exchange core 30C having the first surface 30A and the second surface 30B opposite thereto, and the plurality of blowers 20 that is provided so as to be adjacent to the second surface 30B and causes the air as a gas to flow such that the air passes from the first surface 30A to the second surface 30B by the rotation of the impellers. Then, the heat exchange core 30C includes the plurality of tubes 313 and 323 through which a heating medium that intends to exchange heat with the air flows. Then, each of the tubes 313 and 323 extends in a meandering pattern from the side of the second surface 30B to the side of the first surface 30A, and the heating medium flows from the side of the second surface 30B to the side of the first surface 30A in each of the tubes 313 and 323.

In this configuration, when the air and the heating medium exchange heat in the heat exchange core 30C in a counterflow manner, the entire tubes 313 and 323 and the air exchange heat uniformly, thereby improving the heat exchange efficiency. Further, using the plurality of blowers 20 allows the load of each blower for obtaining a desired cooling capacity to be reduced. As a result, it is possible to reduce the power of the blower[s] for obtaining a desired cooling capacity, the noise, and the size of the heat exchange core. Further, by causing the heating medium to flow through the plurality of tubes 313 and 323, it is possible to reduce the length of the entire flow path of the tubes 313 and 323 and prevent the flow path shape from being complicated. This allows the power of the pump for causing the heating medium to flow to be reduced and the power consumption of the pump for obtaining a desired cooling capacity to be reduced. As a result, it is possible to improve the COP. Further, by adopting the air-cooling system, it is possible to reduce the introduction cost and prevent dust or the like from scattering because the power of the blower for obtaining a desired capacity can be reduced as described. Therefore, it is possible to suitably realize efficient cooling while reducing the introduction cost and the space occupied by devices.

Further, the heat exchanger 30 includes the inflow portions 315 and 325 that receives a heating medium from the outside and causes it to flow into the tubes 313 and 323. Then, the tubes 313 and 323 are respectively connected to the inflow portions 315 and 325 such that they branch off from the inflow portions 315 and 325 at appropriate positions. In this case, by causing the heating medium to flow into the corresponding plurality of tubes 313 and 323 in parallel from the inflow portions 315 and 325, it is possible to effectively reduce the power of the pump (41, 42) for causing the heating medium to flow and simplify the structure of inflow path of the heating medium into the tubes 313 and 323.

Further, the plurality of blowers 20 is arranged such that the extension of the rotation axis Ax of the impeller 21 is orthogonal to the second surface 30B, and the tube 313 forms a meandering shape by alternately and sequentially connecting the main flow path element 313a extending linearly and the U-shaped return flow path element 313b. Then, the adjacent main flow path elements 313a connected by the return flow path element 313b do not overlap at least in part when viewed in the direction from the first surface 30A to the second surface 30B. In this case, the air easily comes into contact with each main flow path element 313a, which improves the heat exchange efficiency and allows the power of the blower 20 to be effectively reduced. Note that the tube 323 also has a structure similar to that of the tube 313.

Further, the heat exchanger 30 includes the plurality of plate fins 314 and 324 that extends parallel to the direction from the first surface 30A to the second surface 30B and is arranged in the direction orthogonal to the direction from the first surface 30A to the second surface 30B, in this example, in the horizontal direction. Then, the tubes 313 and 323 extend in a meandering pattern from the side of the second surface 30B to the side of the first surface 30A while penetrating the plate fins 314 and 324 and come into contact with the plate fins 314 and 324. In this case, the dissipating heat from the plate fins 314 and 324 improves the heat exchange efficiency. In particular, since the plate fins 314 and 324 extend parallel to the axial flow direction, it is possible to suppress the pressure loss and effectively reduce the power of the blower 20.

Further, the plurality of blowers 20 is arranged in a plurality of rows and a plurality of columns. In this case, even if some of the blowers 20 have failed, it is possible to effectively maintain the blowing function and prevent the cooling performance from decreasing. Further, as compared with the configuration in which one blower is provided so as to cover the wide range of the heat exchange core 30C, it is possible to reduce the power for obtaining a desired air volume and provide a large effective range for the heat exchange of the heat exchange core 30C. As a result, it is possible to effectively reduce the power of the blower 20 for obtaining a desired cooling capacity and improve the cooling efficiency.

Further, the heat exchange core 30C includes the upper heat exchange core 310 and the lower heat exchange core 320, and the upper heat exchange core 310 is stacked on the lower heat exchange core 320. The heat exchanger 30 includes, as the inflow portions 315 and 325, the upper inflow portion 315 that is connected to the tube 313 in the upper heat exchange core 310 and the lower inflow portion 325 that is connected to the tube 323 in the lower heat exchange core 320. Then, each of the upper inflow portion 315 and the lower inflow portion 325 extends in the up-and-down direction. Then, the upper inflow portion 315 and the lower inflow portion 325 are arranged such that they are shifted in the direction from the first surface 30A to the second surface 30B and the lower part of the upper inflow portion 315 overlaps with the upper part of the lower inflow portion 325 when viewed in the direction from the first surface 30A to the second surface 30B.

In this case, since the heating medium can be branched and supplied to the upper heat exchange core 310 and the lower heat exchange core 320 from the two pumps 41 and 42, it is possible to reduce the power of the pumps 41 and

42. Further, with the arrangement in which the lower part of the upper inflow portion 315 overlaps with the upper part of the lower inflow portion 325, it is possible to ensure a large size of the entire heat exchange core 30C while reducing the range occupied by the entire heat exchanger 30 and thus improve the heat exchange efficiency.

(Example of Condition Setting)

An example of a specific usage aspect of the above-mentioned server cooling system S will be described below. The present inventors estimate that a large number of server racks with specifications that produce approximately 150 kW of heat generation per unit will be introduced in future data centers. Then, the above-mentioned server cooling system S can be configured to function extremely effectively at the cooling capacity of 150 kW or around it.

Specifically, by setting the following conditions (1) to (3) for the exhaust heat device 1, it is possible to make the exhaust heat device 1 carry out cooling at 150 kw or around it with an extremely high coefficient of performance (COP).

Condition (1): Set the area of each of the first surface 30A and the second surface 30B of the heat exchange core 30C to 1.5 m$^2$ or more and 1.7 m$^2$ or less.

Condition (2): Set the flow rate of the gas (air) caused to flow by the plurality of blowers 20 to 345 m$^3$/min or more and 375 m$^3$/min or less.

Condition (3): Select a heating medium and set the flow rate of the heating medium such that a value (C·L) obtained by multiplying a specific heat C (KJ/kg·K) of the heating medium at 20° C. to 40° C. and a flow rate L (L/min) of the heating medium is 250 or more and 320 or less.

Under the above conditions, the server cooling system S is capable of outputting the cooling capacity of 140 kw or more and 160 kW or less with the COP of 15 or more. Note that the present inventors have confirmed that more specifically, the server cooling system S is capable of outputting the cooling capacity of 140 KW or more and 160 KW or less with a COP of 20 or more on average, and a COP of at least 15 or more even if there are fluctuations due to various conditions.

In the case where the above condition (1) is set, the size of the fin that can be installed and the size of the heat exchange part are generally determined. Desirably, the total area of the heat exchange surfaces of the plate fins 314 and 324 provided in the heat exchanger 30 and the heat exchange surfaces of the tubes 313 and 323 is set to 600 m$^2$ or more. The heat exchange surfaces of the plate fins 314 and 324 mean the two surfaces of the respective plate fins 314 and 324 opposite to each other in the thickness direction. The heat exchange surfaces of the tubes 313 and 323 mean the outer surfaces of the tubes 313 and 323 exposed to the outside. The total of both areas is determined by adding the value obtained by multiplying the total area of the above two surfaces of the respective plate fins 314 and 324 by the total number of the plate fins 314 and 324, and the value of the surface areas of the outer surfaces of the tubes 313 and 323 excluding the connection portions with the plate fins 314 and 324.

Further, an outer diameter D of the tubes 313 and 323 may be 8 mm or more and 20 mm or less. For example, the interval between the tubes 313 or 323 adjacent to each other in the up-and-down direction in FIG. 5 may be 0.5 D or more and 1.5 D or less.

The flow rate determined in the above condition (2) is not an excessively large flow rate but a value beneficial in terms of power reduction. In addition thereto, it is also desirable from the viewpoint of reducing noise and preventing dust from scattering. The flow rate of the gas (air) caused to flow by the plurality of blowers 20 in the condition (2) is determined by the total value of the flow rate set for each blower 20.

Further, in addition to the above conditions (1) to (3), it is desirable that the heat exchange core 30C is configured such that the pressure loss when the air is caused to pass at a wind speed of 5.5 m/s is 5 Pa or less.

FIG. 10 shows a table that describes an example of the specifications of the server cooling system S that uses, as a heating medium, a polyethylene glycol aqueous solution whose specific heat is 3.841 (KJ/kg·K) at 40° C. and outputs the cooling capacity of 150 kw while satisfying the above conditions (1) to (3). In this examples of the specifications, when the temperature of the server 102 of the server rack 100 rises to 70° C. and generates heat of 150 kW, the server 102 is cooled to 40° C. and 150 kW of heat is absorbed. In the examples of the specifications in FIG. 10, the cooling of 150 kW is achieved with a COP or 15 or more.

In the knowledge of the present inventors, when attempting to cool 150 kw in a general cooling system used in previous data centers, the COP thereof is approximately 5 to 10. The server cooling system S according to this embodiment is capable of outputting an equivalent cooling capacity with a COP (in this example, 15 or more) that is approximately twice or more than that in the previous system. Such a cooling capacity of the server cooling system S makes a significant contribution to energy conservation.

Note that the heating medium caused to flow in the heat exchanger 30 is not particularly limited. For example, as a heating medium, a fluorine-based inert liquid whose specific heat is approximately 1.000 to 1.200 (KJ/kg·K) at 20° C. may be used. In this case, the flow rate of the heating medium is set to approximately 195 to 320 (L/min). In the case where the flow rate is relatively large as described above, it is expected that effective cooling can be achieved by increasing the number of flow paths of the server rack 100 or making the flow path shape complicated and causing a large amount of the heating medium to flow. Note that since the fluorine-based inert liquid has relatively low viscosity, the power of the pump does not becomes excessively large. In the case where a heating medium whose specific heat is relatively low is used as described above, the heating medium cooling efficiency (LPM/kW) determined by dividing the flow rate (L/min: LPM) of the heating medium by the cooling capacity is favorably set to 1.4 or more. This heating medium cooling efficiency may be 1.4 or more and 1.6 or less or 1.45 or more and 1.55 or less.

MODIFIED EXAMPLE

Modified examples will be described below. In the following modified examples, the same elements as those in the above-mentioned embodiment will be denoted by the same reference symbols and duplicate description will be omitted.

First Modified Example

Figure 11:
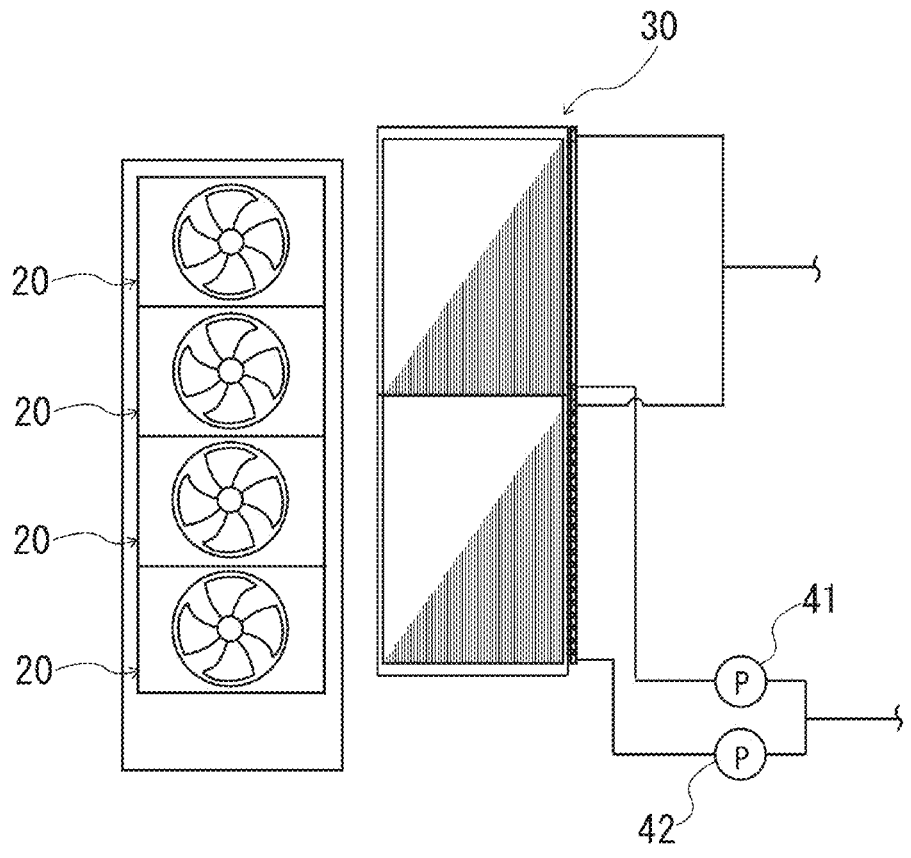
FIG. 11 is a diagram showing an exhaust heat device according to a first modified example.

FIG. 11 shows an exhaust heat device according to a first modified example. In this modified example, four blowers 20 are arranged in single vertical line. In the heat exchanger 30, the first pump 41 is connected to the upper stage side and the second pump 42 is connected to the lower stage side. The use of a plurality of pumps is beneficial in specifications where the heat exchanger is long in the up-and-down direction.

Second Modified Example

Figure 12:
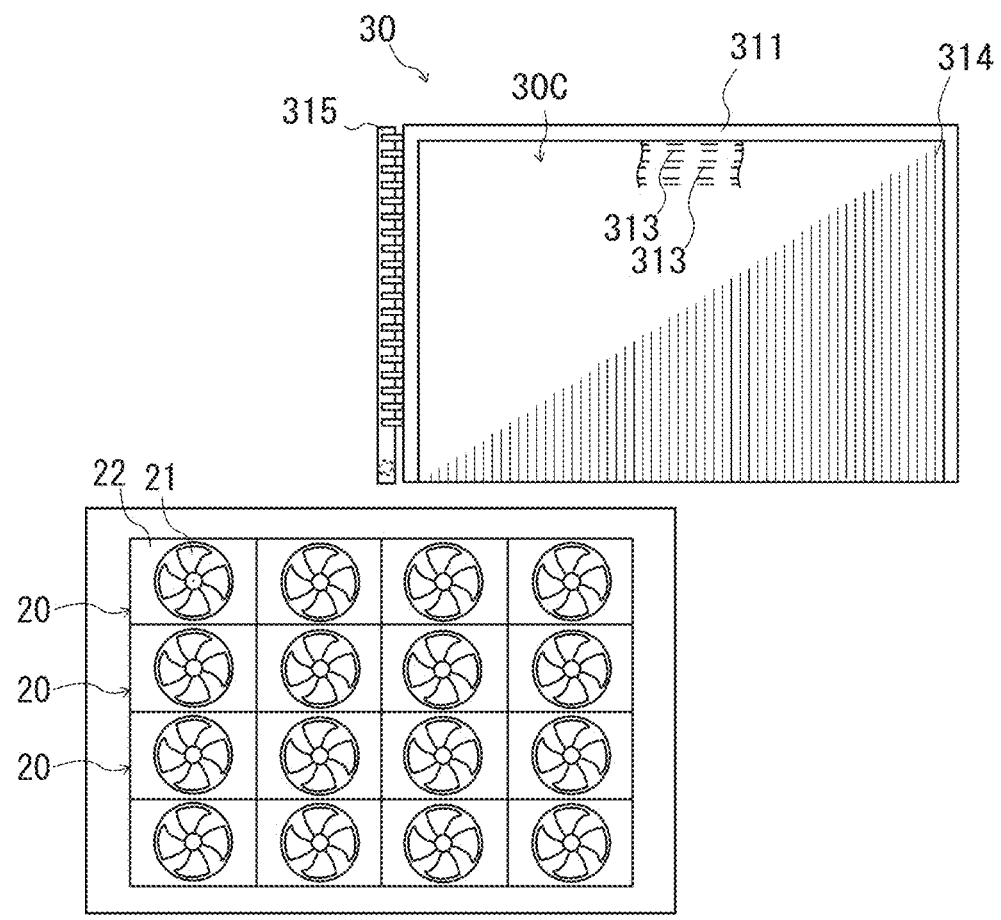
FIG. 12 is a diagram showing an exhaust heat device according to a second modified example.

FIG. 12 shows an exhaust heat device according to a second modified example. In this modified example, the heat exchange core 30C of the heat exchanger 30 does not have a multi-stage structure. The heat exchange core 30C includes only the part corresponding to the upper heat exchange core 310. The plurality of blowers 20 is arranged adjacent to each other in four rows and four columns in the heat exchange core 30C. Note that although the heat exchange core 30C has a configuration in which the upper heat exchange core 310 and the lower heat exchange core 320 are connected in the above-mentioned embodiment, the heat exchange core 30C may have a configuration in which three or more heat exchange core elements are connected.

Third Modified Example

Figure 13:
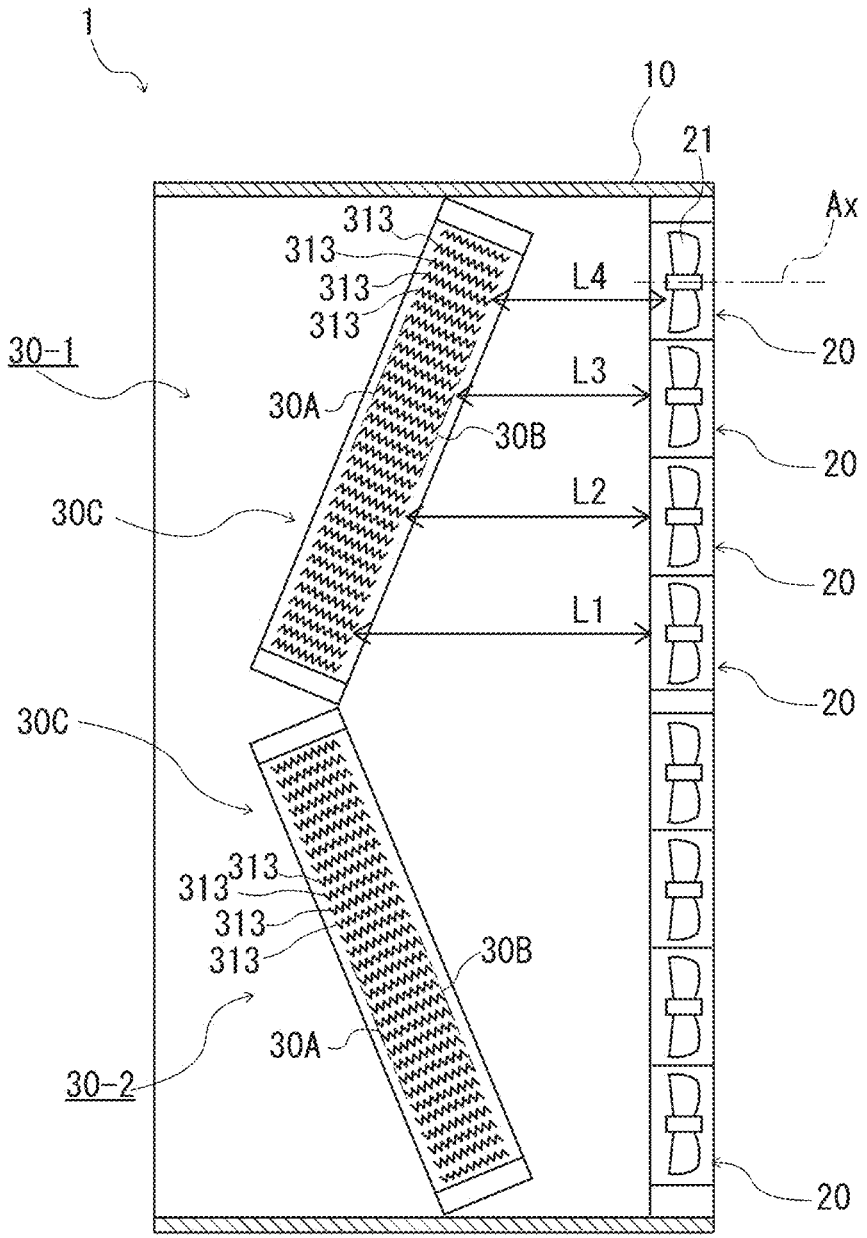
FIG. 13 is a diagram showing an exhaust heat device according to a third modified example.

FIG. 13 shows an exhaust heat device according to a third modified example. In detail, FIG. 13 is a diagram of the inside of the exhaust heat device when viewed along the horizontal direction orthogonal to the direction in which the air as a gas flows by the blower 20. The exhaust heat device according to the third modified example includes a first heat exchanger 30-1 and a second heat exchanger 30-2. The first heat exchanger 30-1 and the second heat exchanger 30-2 are spaced apart from each other and are not connected.

The first heat exchanger 30-1 and the second heat exchanger 30-2 each have a rectangular parallelepiped or plate shape and are arranged so as to be adjacent to each other vertically and form a V-shape when viewed in the horizontal direction.

The first heat exchanger 30-1 and the second heat exchanger 30-2 are each configured to include the upper heat exchange core 310 described in the above-mentioned embodiment as the main part. In FIG. 13, of the elements configuring the first heat exchanger 30-1 and the second heat exchanger 30-2, the same elements as those configuring the upper heat exchange core 310 are denoted by the same reference symbols. Although not shown, the first heat exchanger 30-1 and the second heat exchanger 30-2 each include a plurality of plate fins 314 that extends parallel to the direction from the first surface 30A to the second surface 30B and is arranged in the direction orthogonal to the direction from the first surface 30A to the second surface 30B, in this example, in the horizontal direction. Then, the tubes 313 in the first heat exchanger 30-1 and the second heat exchanger 30-2 are arranged such that they are aligned in the respective directions in which the first heat exchanger 30-1 and the second heat exchanger 30-2 are inclined. Meanwhile, in the case where the first heat exchanger 30-1 and the second heat exchanger 30-2 are arranged to form a V-shape as in this modified example, the tubes 313 may be arranged in a matrix pattern instead of the staggered arrangement as in the above-mentioned embodiment, because suitable heat exchange can be performed even with the arrangement of the matrix pattern.

The plurality of blowers 20 is arranged so as to be adjacent to the first heat exchanger 30-1 (second surface 30B) and the second heat exchanger 30-2 (second surface 30B) that are arranged to form a V-shape. The plurality of blowers 20 is arranged on the same plane. In detail, some of the plurality of blowers 20 are arranged so as to be adjacent to the first heat exchanger 30-1 and the others of the plurality of blowers 20 are arranged so as to be adjacent to the second heat exchanger 30-2. Although not shown, in this example, 16 blowers 20 arranged in four rows and four columns are arranged so as to be adjacent to the first heat exchanger 30-1, and 16 blowers 20 arranged in four rows and four columns are arranged so as to be adjacent to the second heat exchanger 30-2. In more detail, the 16 blowers 20, which are some of the plurality of blowers 20, are arranged so as to be adjacent to the first heat exchanger 30-1 such that the extension of the rotation axis Ax of each impeller 21 intersects with the second surface 30B of the heat exchange core 30C of the first heat exchanger 30-1. The 16 blowers 20, which are the others of the plurality of blowers 20, are arranged so as to be adjacent to the second heat exchanger 30-2 such that the extension of the rotation axis Ax of each impeller 21 intersects with the second surface 30B of the heat exchange core 30C of the second heat exchanger 30-2. However, the number of blowers 20 to be used is not particularly limited.

Note that although the first heat exchanger 30-1 and the second heat exchanger 30-2 are arranged to form a V-shape at an obtuse angle in the example in FIG. 13, they may be arranged to form a V-shape at an acute angle or may be arranged such that the first heat exchanger 30-1 and the second heat exchanger 30-2 are not inclined in a symmetrical manner.

Further, in FIG. 13, reference symbols L1 to L4 indicate the distances between the plurality of (four) blowers 20 arranged in the up-and-down direction and (the heat exchange core 30C of) the first heat exchanger 30-1. The closer to the bottom of the V-shape, the longer the distance from the blower 20 to the heat exchange core 30C, thereby obtaining the following relationship: L1>L2>L3>L4. Here, in the third modified example, the settings of the flow rate of the air as a gas to be caused to flow by the plurality of blowers 20 and/or the settings of the rotation speed of the plurality of blowers 20 differ depending on the distance between each blower 20 and the first heat exchanger 30-1 adjacent to the blower 20.

In detail, in this modified example, each blower 20 has the same structure and the same size, and is basically driven at the same rotation speed to output the same amount of air when given the same amount of electric power. Here, in this modified example, the value of electric power to be supplied to the blower 20 is changed depending on the distance between the blower 20 and the first heat exchanger 30-1.

Specifically, in the case where the first heat exchanger 30-1 is inclined with respect to the up-and-down direction and the rotation axis of the blower 20 is along the horizontal direction as in this modified example, the air flowing in the horizontal direction can flow at an angle to the direction orthogonal to the first surface 30A and the second surface 30B of the first heat exchanger 30-1 when passing through the first heat exchanger 30-1. At this time, the air flowing out from the second surface 30B of the first heat exchanger 30-1 can entirely tend to flow with the component from the side of the blower 20 where the distance to the heat exchange core 30C is short to the side of the blower 20 where the distance is long. In this case, there is a possibility that the ratio of the component of the air inclined with respect to the impeller 21 increases in the air sucked in the blower 20 and the smooth flow of the air is impaired. In this regard, for example, the flow rate of the blowers 20 may be set such that the following relationship: the flow rate of the blower 20 with a distance to the heat exchange core 30C of L1<the flow rate of the blower 20 with a distance to the heat exchange core 30C of L2<the flow rate of the blower 20 with a distance to the heat exchange core 30C of L3<the flow rate of the blower 20 with a distance to the heat exchange core 30C of L4 is achieved. In other words, the rotation speed of the blowers 20 may be set such that the following relationship: the rotation speed of the blower 20 with a distance to the heat exchange core 30C of L1<the rotation speed of the blower 20 with a distance to the heat exchange core 30C of L2<the rotation speed of the blower 20 with a distance to the heat exchange core 30C of L3<the rotation speed of the blower 20 with a distance to the heat exchange core 30C of L4 is achieved. For example, with such settings, the air easily passes through the first heat exchanger 30-1 and the efficiency of cooling can be improved. In other words, the pressure loss can be suppressed and thus, the efficiency of cooling can be improved.

That is, in the case where the first heat exchanger 30-1 and the second heat exchanger 30-2 are arranged so as to form a V-shape and the distance from each blower 20 to the heat exchanger is not constant, by making the flow rate or the rotation speed of the blower 20 with a relatively short distance to the heat exchange core 30C, of the plurality of blowers 20, larger than that of the blower 20 with a longer distance to the heat exchange core 30C than this blower 20 with the relatively short distance, the air can flow smoothly. However, depending on the structure of the exhaust heat device, the flow rate or the rotation speed of the blower 20 with a short distance to the heat exchange core 30C, of the plurality of blowers 20, may be made smaller than that of the blower 20 with a long distance to the heat exchange core 30C, which is advantageous in some cases.

Fourth Modified Example

Figure 14:
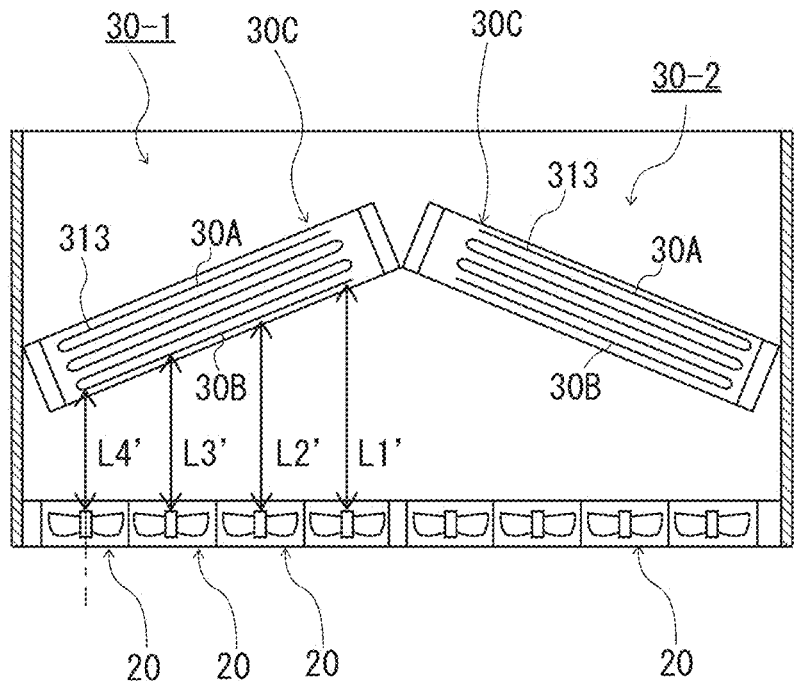
FIG. 14 is a diagram showing an exhaust heat device according to a fourth modified example.

FIG. 14 shows an exhaust heat device according to a fourth modified example. In detail, FIG. 14 is a diagram of the inside of the exhaust heat device. The exhaust heat device according to the fourth modified example includes the first heat exchanger 30-1 and the second heat exchanger 30-2 similar to those in the third modified example. However, the fourth modified example is different from the third modified example in that the first heat exchanger 30-1 and the second heat exchanger 30-2 are adjacent to each other in the horizontal direction and arranged so as to form a V-shape when viewed from above.

In FIG. 14, 16 blowers 20 arranged in four rows and four columns are arranged so as to be adjacent to the first heat exchanger 30-1, and 16 blowers 20 arranged in four rows and four columns are arranged so as to be adjacent to the second heat exchanger 30-2. In detail, the 16 blowers 20, which are some of the plurality of blowers 20, are arranged so as to be adjacent to the first heat exchanger 30-1 such that the extension of the rotation axis Ax of each impeller 21 intersects with the second surface 30B of the heat exchange core 30C of the first heat exchanger 30-1. The 16 blowers 20, which are the others of the plurality of blowers 20, are arranged so as to be adjacent to the second heat exchanger 30-2 such that the extension of the rotation axis Ax of each impeller 21 intersects with the second surface 30B of the heat exchange core 30C of the second heat exchanger 30-2. However, the number of blowers 20 to be used is not particularly limited. Further, although the first heat exchanger 30-1 and the second heat exchanger 30-2 are arranged to form a V-shape at an obtuse angle in the example of FIG. 14, they may be arranged to form a V-shape at an acute angle or may be arranged such that the first heat exchanger 30-1 and the second heat exchanger 30-2 are not inclined in a symmetrical manner. Further, although not shown, the first heat exchanger 30-1 and the second heat exchanger 30-2 each include a plurality of plate fins 314 that extends parallel to the direction from the first surface 30A to the second surface 30B and is arranged in the direction orthogonal to the direction from the first surface 30A to the second surface 30B, in this example, in the horizontal direction. Then, the tubes 313 in the first heat exchanger 30-1 and the second heat exchanger 30-2 are arranged such that the first heat exchanger 30-1 and the second heat exchanger 30-2 are aligned in the up-and-down direction.

Then, in FIG. 14, reference symbols L1' to L4' indicate the distances between the plurality of (four) blowers 20 arranged in the horizontal direction and (the heat exchange core 30C of) the first heat exchanger 30-1. The closer to the bottom of the V-shape, the longer the distance from the blower 20 to the heat exchange core 30C, thereby obtaining the following relationship: L1'>L2'>L3'>L4'. In the fourth modified example, the settings of the flow rate of the air as a gas to be caused to flow by the plurality of blowers 20 and/or the settings of the rotation speed of the plurality of blowers 20 differ depending on the distance between each blower 20 and the first heat exchanger 30-1 adjacent to the blower 20.

In detail, in this modified example, each blower 20 has the same structure and the same size, and is basically driven at the same rotation speed to output the same amount of air when given the same amount of electric power. Then, in this modified example, the value of electric power to be supplied to the blower 20 is changed depending on the distance between the blower 20 and the first heat exchanger 30-1.

Specifically, in the case where the rotation axis of the blower 20 is along the horizontal direction and the first heat exchanger 30-1 is inclined with respect to the direction orthogonal to the rotation axis of the blower 20 in the horizontal plane as in this modified example, the air flowing in the horizontal direction can flow at an angle to the direction orthogonal to the first surface 30A and the second surface 30B of the first heat exchanger 30-1 when passing through the first heat exchanger 30-1. At this time, the air flowing out from the second surface 30B of the first heat exchanger 30-1 can entirely tend to flow with the component from the side of the blower 20 where the distance to the heat exchange core 30C is short to the side of the blower 20 where the distance is long. In the case where the plate fins 314 extend parallel to the direction from the first surface 30A to the second surface 30B and are arranged in the horizontal direction as in the configuration of this modified example, such a tendency is particularly likely to occur. In this case, there is a possibility that the ratio of the component of the air inclined with respect to the impeller 21 increases in the air sucked in the blower 20 and the smooth flow of the air is impaired.

In this regard, in this modified example, for example, the flow rate of the blower 20 may be set such that the following relationship the flow rate of the blower 20 with a distance to the heat exchange core 30C of L1'<the flow rate of the blower 20 with a distance to the heat exchange core 30C of L2'<the flow rate of the blower 20 with a distance to the heat exchange core 30C of L3'<the flow rate of the blower 20 with a distance to the heat exchange core 30C of L4' is achieved. In other words, the rotation speed of the blowers 20 may be set such that the following relationship: the rotation speed of the blower 20 with a distance to the heat exchange core 30C of L1'<the rotation speed of the blower 20 with a distance to the heat exchange core 30C of L2'<the rotation speed of the blower 20 with a distance to the heat exchange core 30C of L3'<the rotation speed of the blower 20 with a distance to the heat exchange core 30C of L4' is achieved. In this case, effects similar to those described in the third modified example can be achieved.

Fifth Modified Example

Figure 15:
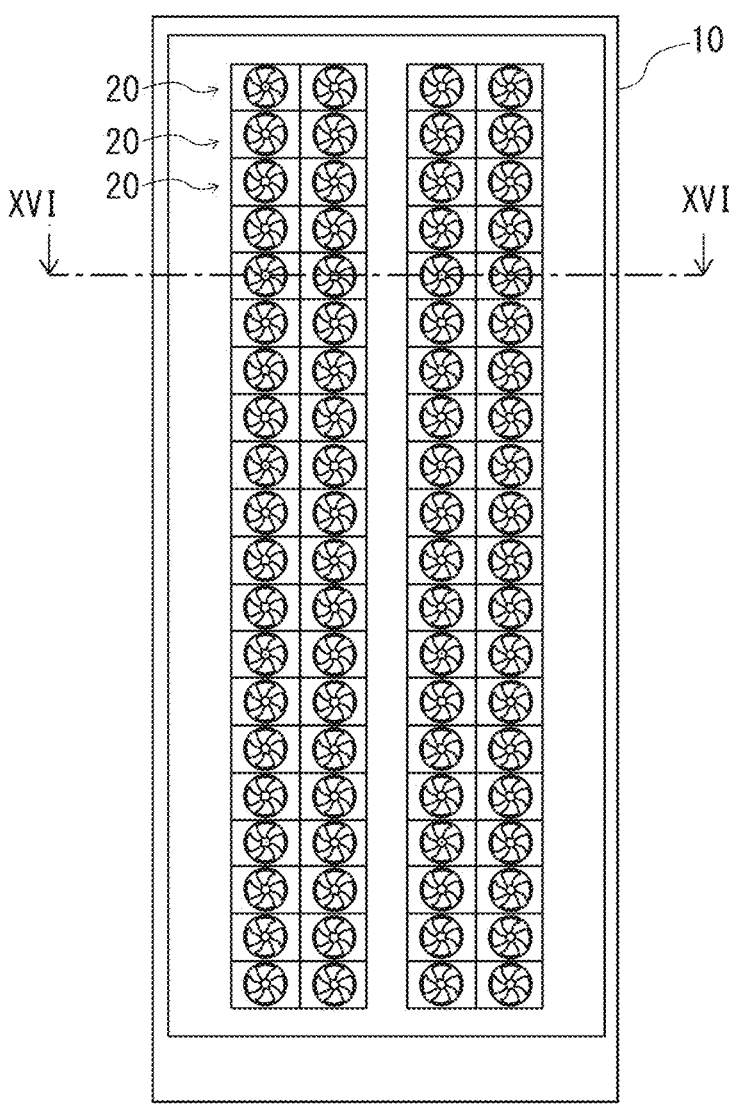
FIG. 15 is a diagram showing an exhaust heat device according to a fifth modified example.
Figure 16:
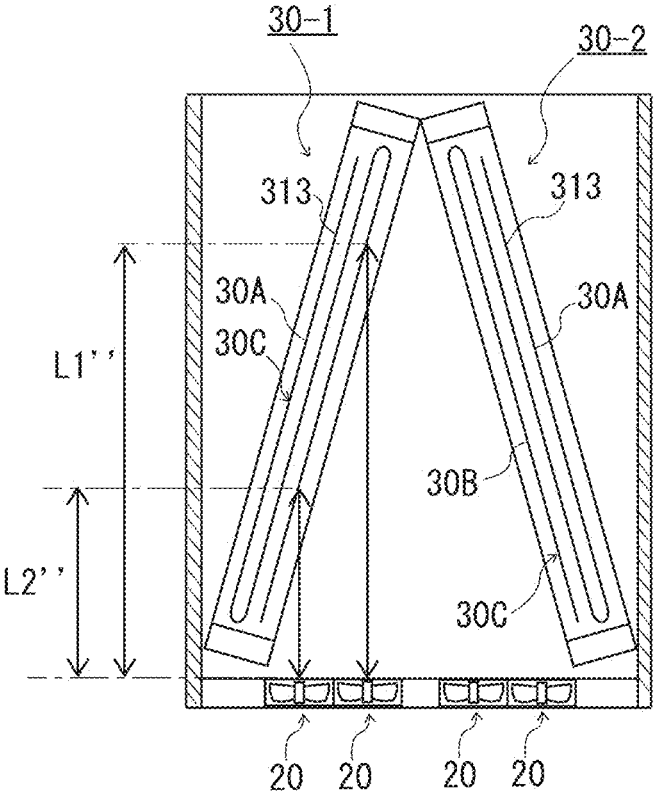
FIG. 16 is a cross-sectional view of the fifth modified example taken along the line XVI-XVI in FIG. 15.

FIG. 15 and FIG. 16 each show an exhaust heat device according to a fifth modified example. In detail, FIG. 15 shows the appearance of the exhaust heat device according to the fifth modified example, and FIG. 16 is a cross-sectional view taken along the line XVI-XVI in FIG. 15. The exhaust heat device according to the fifth modified example includes the first heat exchanger 30-1 and the second heat exchanger 30-2 that are arranged to form a V-shape when viewed from above, similarly to the fourth modified example. However, the fifth modified example is different from the fourth modified example in that the first heat exchanger 30-1 and the second heat exchanger 30-2 are arranged to form a V-shape at an acute angle.

Then, in this modified example, 40 blowers 20 arranged in 20 rows and 2 columns are arranged so as to be adjacent to the first heat exchanger 30-1, and 40 blowers 20 arranged in 20 rows and 2 columns are arranged so as to be adjacent to the second heat exchanger 30-2. In detail, the 40 blowers 20 arranged in 20 rows and 2 columns, which are some of the plurality of blowers 20, are arranged so as to be adjacent to the first heat exchanger 30-1 such that the extension of the rotation axis Ax of each impeller 21 intersects with the second surface 30B of the heat exchange core 30C of the first heat exchanger 30-1. The 40 blowers 20 arranged in 20 rows and 2 columns, which are the others of the plurality of blowers 20, are arranged so as to be adjacent to the second heat exchanger 30-2 such that the extension of the rotation axis Ax of each impeller 21 intersects with the second surface 30B of the heat exchange core 30C of the second heat exchanger 30-2. Each blower 20 is arranged on the same plane and held in the enclosure 10. The number of blowers 20 to be used is not particularly limited, but it is favorable to provide blowers arranged in a plurality of rows and a plurality of columns for one heat exchanger.

Then, in FIG. 16, reference symbols L1" and L2" indicate the distances between a plurality of (two) blowers 20 arranged in the horizontal direction and (the heat exchange core 30C of) the first heat exchanger 30-1. The closer to the bottom of the V-shape, the longer the distance from the blower 20 to the heat exchange core 30C, thereby obtaining the following relationship: L1">L2". In the fifth modified example, the settings of the flow rate of the air as a gas to be caused to flow by the plurality of blowers 20 and/or the settings of the rotation speed of the plurality of blowers 20 differ depending on the distance between each blower 20 and the first heat exchanger 30-1 adjacent to the blower 20.

Specifically, the flow rate of the blowers 20 is set such that the following relationship: the flow rate of the blower 20 with a distance to the heat exchange core 30C of L1"<the flow rate of the blower 20 with a distance to the heat exchange core 30C of L2" is achieved. In other words, the rotation speed of the blowers 20 is set such that the following relationship: the rotation speed of the blower 20 with a distance to the heat exchange core 30C of L1"<the rotation speed of the blower 20 with a distance to the heat exchange core 30C of L2" is achieved.

That is, in this modified example, by making the flow rate or the rotation speed of the blower 20 with a relatively short distance to the heat exchange core 30C, of the plurality of blowers 20, larger than that of the blower 20 with a longer distance to the heat exchange core 30C than this blower 20 with the relatively short distance, the air can flow smoothly. In the case where the first heat exchanger 30-1 and the second heat exchanger 30-2 are arranged so as to form a V-shape at an acute angle, such settings of the flow rate or rotation speed can be particularly effective.

Note that in the third to fifth modified examples, the first heat exchanger 30-1 and the second heat exchanger 30-2 arranged so as to form a V-shape are arranged such that the bottom of the V-shape faces the side opposite to the side of the blower 20. Instead of such a layout, the first heat exchanger 30-1 and the second heat exchanger 30-2 may be arranged such that the bottom of the V-shape faces the side of the blower 20.

The above-mentioned embodiment and modified examples are examples for embodying the present invention, and the present invention can be carried out in various other embodiments. For example, various modifications, substitutions, omissions, or combinations thereof are possible without departing from the essence of the present invention. Embodiments with such modifications, substitutions, omissions, and the like are also included the scope of the present invention, and are included within the scope of the invention described in the claims and its equivalents.

REFERENCE SIGNS LIST

S Server cooling system, 1 exhaust heat device, 10 enclosure, 20 blower, 21 impeller, 22 casing, 30 heat exchanger, 30-1 first heat exchanger, 30-2 second heat exchanger, 30A first surface, 30B second surface, 30C heat exchange core, 310 upper heat exchange core, 310A upper first surface, 310B upper second surface, 311 upper frame, 313 tube, 313a main flow path element, 313b return flow path element, 314 plate fin, 315 upper inflow portion (inflow portion), 315a inlet, 315P upper inlet pipe, 315b upper first relay pipe, 316 upper outflow portion (outflow portion), 316a upper second relay pipe, 316b outlet, 316P upper outlet pipe, 320 lower heat exchange core, 320A lower first surface, 320B lower second surface, lower frame, 323 tube, 324 plate fin, 325 lower inflow portion (inflow portion), 325a inlet, 325P lower inlet pipe, 325b lower first relay pipe, 326 lower outflow portion (outflow portion), 326a lower second relay pipe, 326b outlet, 326P lower outlet pipe, 41 first pump, 42 second pump, 100 Server rack, 101 rack body, 102 server, 110 refrigerant flow path

The invention claimed is:

1. An exhaust heat device, comprising:
an air-cooled heat exchanger that includes a heat exchange core having a first surface and a second surface opposite to the first surface; and
a plurality of blowers that causes a gas to flow such that the gas passes from the first surface to the second surface by rotation of impellers,
the heat exchange core including a plurality of tubes through which a heating medium that intends to exchange heat with the gas flows, each of the plurality of tubes extending in a meandering shape from a side of the second surface to a side of the first surface, the heating medium flowing from the side of the second surface to the side of the first surface in each of the plurality of tubes, wherein
the heat exchanger includes an inflow portion that receives the heating medium from outside and causes the heating medium to flow into the plurality of tubes,
the plurality of tubes branch off in parallel from the inflow portion,
the heat exchange core includes a first heat exchange core and a second heat exchange core, the first heat exchange core and the second heat exchange core being arranged so as to be adjacent to each other,
the heat exchanger includes, as the inflow portion, a first inflow portion that is connected to tubes of the plurality of tubes of the first heat exchange core and a second inflow portion that is connected to the other tubes of the plurality of tubes of the second heat exchange core, which are separated from each other,
the first inflow portion and the second inflow portion extend in a direction in which the first heat exchange core and the second heat exchange core are adjacent to each other, and
the first inflow portion and the second inflow portion are arranged such that they are shifted in a direction from the first surface to the second surface and an end portion on a side of the second heat exchange core of the first inflow portion overlaps with an end portion on a side of the first heat exchange core of the second inflow portion when viewed in the direction from the first surface to the second surface.

2. The exhaust heat device according to claim 1, wherein an inlet of the heating medium in the first inflow portion opens in the direction from the first surface to the second surface or a direction opposed thereto, and an inlet of the heating medium in the second inflow portion opens in the direction from the first surface to the second surface or a direction opposed thereto.

3. The exhaust heat device according to claim 1, wherein the plurality of blowers are arranged in a plurality of rows and a plurality of columns.

4. A server cooling system, comprising:
the exhaust heat device according to claim 1; and
a server rack to which the heating medium is supplied from the exhaust heat device, the server rack including a cooling flow path that receives the heating medium, which has exchanged heat with the gas, and causes it to flow, and returning the heating medium flowing out from the cooling flow path to the exhaust heat device.

* * * * *